United States Patent [19]
Furutani

[11] Patent Number: 5,673,231
[45] Date of Patent: Sep. 30, 1997

[54] SEMICONDUCTOR MEMORY DEVICE IN WHICH LEAKAGE CURRENT FROM DEFECTIVE MEMORY CELL CAN BE SUPPRESSED DURING STANDBY

[75] Inventor: Kiyohiro Furutani, Hyogo, Japan

[73] Assignee: Mitsubishi Denki Kabushiki Kaisha, Tokyo, Japan

[21] Appl. No.: 668,169

[22] Filed: Jun. 21, 1996

[30] Foreign Application Priority Data

Jun. 23, 1995 [JP] Japan ............................ 7-157786
Feb. 1, 1996 [JP] Japan ............................ 8-016738

[51] Int. Cl.$^6$ ............................................ G11C 7/00
[52] U.S. Cl. .................... 365/203; 365/200; 365/189.11
[58] Field of Search ........................... 365/203, 200, 365/189.11, 190, 189.01

[56] References Cited

U.S. PATENT DOCUMENTS 5,349,557  9/1994  Yoshida .................................. 365/200
5,390,150  2/1995  Kwak et al. ........................... 365/200

FOREIGN PATENT DOCUMENTS 3-232200  10/1991  Japan.
5-54693   3/1993   Japan.

OTHER PUBLICATIONS

Tadahiko Sugibayashi et al, A 1Gb DRAM for File Applications, IEEE International Solid–State Circuits Conference, 1995, pp. 254–255.

*Primary Examiner*—David C. Nelms
*Assistant Examiner*—Vu A. Le
*Attorney, Agent, or Firm*—Lowe, Price, LeBlanc & Becker

[57] ABSTRACT

A bit line precharge potential supply interconnection and a bit line pair are connected via N channel MOS transistors in which the gate potentials are controlled by an equalizing signal and a P channel MOS transistor which is in connection with the connection point of N channel MOS transistors. The P channel MOS transistor has its gate connected to a column selecting line. When there is a failure due to short-circuit between a bit line and a word line, the column selecting line is set such that it would be at "H" level during the standby period by disconnecting a fuse element. Accordingly, the connection between the bit line pair and the precharge potential supply interconnection is cut off during the standby period, preventing generation of leakage current and thus suppressing increase in power consumption.

6 Claims, 19 Drawing Sheets

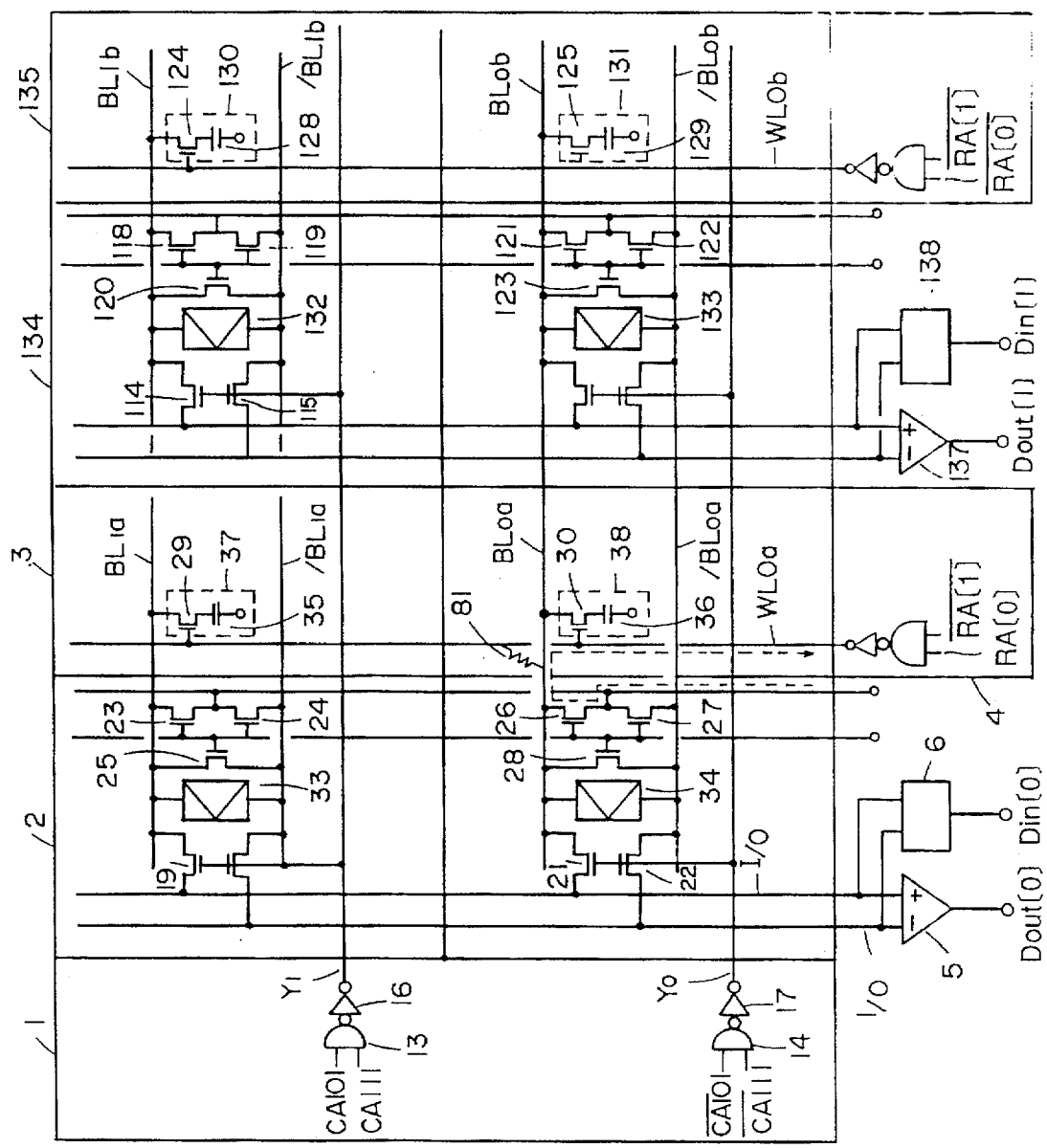
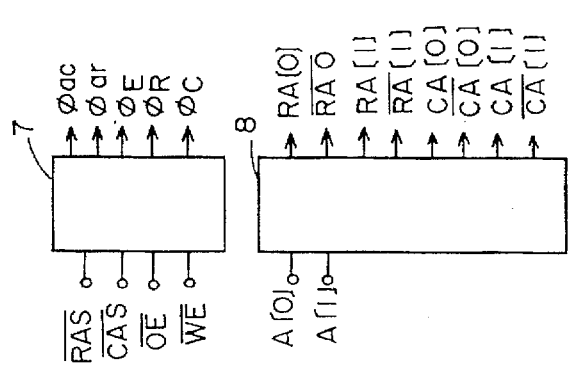
FIG.19

F1, F2 ···· FUSE
Q1 ···· TRANSITOR

SEMICONDUCTOR MEMORY DEVICE IN WHICH LEAKAGE CURRENT FROM DEFECTIVE MEMORY CELL CAN BE SUPPRESSED DURING STANDBY

BACKGROUND OF THE INVENTION

1. Field of the Invention

The present invention relates to a circuit structure of a semiconductor memory device, and particularly to a circuit structure of a semiconductor memory device including a redundant circuit.

2. Description of the Background Art

As semiconductor memory devices, especially dynamic type RAMs (hereinafter referred to as DRAMs), are being integrated to a higher degree, their power consumption during the standby operation tends to increase. Particularly, as the size of the transistor forming the circuit is miniaturized, its subthreshold characteristics are also degraded due to short channel effect or the like, and thus rate of reduction in power consumption during standby tends to be determined by its subthreshold leakage current.

However, in a system employing a large amount of DRAMs, for example, it is necessary to reduce this power consumption during standby as much as possible. Moreover, when the DRAM is operated by a battery or the like, this reduction in power consumption during standby operation is considered to be an indispensable technical subject.

Meanwhile, improvement in the capacity of the DRAM leads to larger chip area and higher complexity of manufacturing process. These factors would cause reduction in the yield, owing to a defective memory cell.

Generally, when a defect occurs due to such defective memory cell, a so-called remedy by the redundant circuit, that is, replacement of the memory cell column in which the defective memory cell exist by the spare memory cell column or the like, is performed.

More specifically, when an address of the defective memory cell mentioned above is designated by an external address signal, a spare memory cell column or the like is selected according to the address information of the defective memory cell which has been stored in advance.

This replacement allows basic operations of the memory cell such as reading and writing of the data without any problem. However, even when this column with defects has been replaced by the redundant circuit, the leakage path of the current generated at the defective portions still exists. Accordingly, this also results in an increase in power consumption during standby of the DRAM and the like.

Description of the above-described problem will be given in further detail with reference to FIG. 19 showing a structure of a first conventional semiconductor memory device 100.

Referring to FIG. 19, a control circuit 7 receives external control signals and outputs a column address activation signal $\phi_{ac}$, a row address activation signal $\phi_{ar}$, an equalizing signal $\phi_E$, a row address latching signal $\phi_R$, a column address latching signal $\phi_C$ and the like which control the operation of the internal circuit. An address buffer circuit 8 receives external address signals A [n] (where n=0, 1, . . . ) and outputs internal row address signals RA [n] and $\overline{RA}$ [n] as well as internal column address signals CA [n] and $\overline{CA}$ [n].

A row decoder 4 is responsive to the internal row address signal from address buffer circuit 8 so as to activate the word line corresponding to the row which corresponds to the signal, for example, WL0a. In response to activation of word line WL0a, a transistor 30 in the memory cell 38 is rendered conductive, and a slight potential difference is generated between bit line pair BL0a and $\overline{BL0a}$ according to the charge which has been stored in a memory cell capacitor 36. This slight potential difference is amplified by a sense amplifier 34. A column decoder 1 responds to the internal column address signal to select the corresponding memory cell column. In response to column selecting signal CSL0 from column decoder 1, transistors 21 and 22 are rendered conductive, and bit line pair BL0a and $\overline{BL0a}$ is brought into connection with inputs of a differential amplifier 5. Differential amplifier 5 outputs an output signal corresponding to the potential difference between the paired bit lines BL0a and $\overline{BL0a}$ to an output pin $D_{out}$ [0].

For the sake of simplification, it is assumed in the following description that memory cell array 63 is provided with memory cells equivalent to memory cell 38 consisting of transistor 30 and capacitor 36 in an arrangement of 4 rows×4 columns, and two memory cell arrays share one column decoder. (The figure shows only two rows and two columns)

More particularly, row decoder 4 selects one word line from the four word lines WL0a, WL0b, WL1a, and WL1b by a 2 bit row address signal. Meanwhile, column decoder 1 selects one column selecting line from four column selecting lines Y0 to Y3 by a 2 bit column address signal.

FIG. 20 is a circuit diagram showing an example of a structure including 1 bit of address buffer circuit 8 in FIG. 19. FIG. 21 is a circuit diagram showing an example of a structure of a signal producing circuit in control circuit 7 which generates column address activation signal $\phi_{ac}$, row address activation signal $\phi_{ar}$, equalizing signal $\phi_E$, row address latching signal $\phi_R$ and column address latching signal $\phi_C$.

Operation of semiconductor memory device 100 in FIG. 19 will now be described hereinbelow with reference to circuit diagrams of FIGS. 20 and 21 as well as to timing chart of FIG. 22.

Before time t1, a signal $\overline{RAS}$ is at an "H" level and semiconductor memory device 100 is in a standby state. At this time, equalizing signal $\phi_E$ is at "H" level so that transistors 26 to 28 are rendered conductive and bit lines BL0a, $\overline{BL0a}$ are charged to a potential of $V_{CC}/2$.

When signal $\overline{RAS}$ attains "L" level at time t1, this signal passes through inverter 99 and then is input as it is to one input of NAND circuit 112. Since signal $\phi_R$ attains "L" level at time t2, the row addresses input to address pins A [0] and A [1] are held in a latch circuit of FIG. 20 formed by inverters 83 and 84. In addition, an output signal of inverter 99 is received by an input of an NAND circuit 111 and its output signal is inverted by inverter 105 to be a row address activation signal $\phi_{ar}$, which is changed to "H" level at time t3 and is input to NAND circuits 93 and 94 resulting in output of internal row address signals RA [n] and $\overline{RA}$ [n]. According to internal row address signals RA [n] and $\overline{RA}$ [n] (where n=0, 1), row decoder 4 changes WL0a and WL0b to "H" level when input row address is obtained as A [0]=0 and A [1]=0, for example.

Then, the data held at memory cell 38 is read out to bit line BL0a. Sense amplifier 80 amplifies the data read out to the bit line.

At time t1 to time t5, since the output of inverter 99 which is the first input signal of the NAND circuit is at "H" level, $\overline{CAS}$ which is the second input signal is at "H" level and the output of inverter 108 which is the third input signal is at "H" level, the output signal of column address latching signal $\phi_C$ is at "L" level which is inverted by inverter 109 to result in an "H" level. When signal $\overline{CAS}$ attains "L" level at time t4, the output of NAND circuit 113 attains "H" level, and $\phi_C$ which is the output signal of inverter 109 reaches "L" level at time t5. Accordingly, column address signal input to address pins A [0] and A [1] are held in a latch circuit formed by inverters 88 and 89.

In addition, since column address activation signal $\phi_{ac}$ attains "H" level at time t3 which comes after delay time of inverters 100 to 103 have passed from time t1 when $\overline{RAS}$ signal attains "L" level, column address signals CA [n] and $\overline{CA}$ [n] are output from address buffer circuit 8.

According to column address signals CA [n] and $\overline{CA}$ [n] (where n=0, 1), column decoder 1 changes column selecting line Y0 to "H" level when the input column addresses are A [0]=0, A [1]=0.

Accordingly, since transistors 21 and 22 are rendered conductive, data of bit lines BL0a and $\overline{BL0a}$ are read out to input/output lines I/O and $\overline{I/O}$. Differential amplifier 5 amplifies the potential difference between the paired input/output lines to output the data to output pin $D_{out}$ [0].

Since the structure of the conventional semiconductor memory device 100 is as described above, equalizing signal $\phi_E$ is at "H" level during standby and bit lines BL0a and $\overline{BL0a}$ are charged to an intermediate potential $V_{CC}/2$ through transistors 26, 27 and the like. Accordingly, when there is a short-circuit between bit line BL0 and word line WL0 owing to a defect 81 at the time of manufacturing, word line WL0a is at "L" level during standby such that leakage current flows from bit line BL0a at intermediate potential $V_{CC}/2$ to word line WL0a (as shown by an arrow with broken line in FIG. 19), and thus the current consumed would exceed the specification value and semiconductor memory device 100 would be a defective product.

As a second conventional example for solving the problem as described above, a circuit diagram of the principal portions of a semiconductor memory device disclosed in Japanese Patent Laying-Open No. 3-232200 is shown in FIG. 23.

Referring to FIG. 23, a memory cell array portion 201 includes a plurality of normal memory cell columns each provided with first and second bit lines DL1, $\overline{DL1}$ forming a pair in connection with a plurality of memory cells MC, a precharging circuit 211 for precharging bit lines DL1, $\overline{DL1}$ to a prescribed level according to a precharge control signal $\phi_P$ conducted through a transistor Q1, and the transistor Q1 turned on/off by control signal $\phi_C$ to conduct precharge control signal $\phi_P$ to precharge circuit 211, as well as a memory cell column for redundancy (not shown).

A redundant decoder circuit 203 includes a replacement address program circuit 231. When there is a defective portion in the normal memory cell column of memory cell array portion 201, this replacement address program circuit 231 sets the address of the memory cell column of the defective portion. When an external Y address signal corresponds to the defective bit address, signals (A1, $\overline{YSW_R}$) for replacing the memory cell column with defective portion by memory cell column for redundancy are output. More specifically, the signal for detecting a replacement address is output from one end of each fuse (F1, F2, . . . ) which sets the replacement address.

A replacement address detection control circuit 207 includes a plurality of logic circuits 271. During the performance of precharging when precharge control signal $\phi_P$ is at an activated level, it detects and outputs by an active signal $\phi_{A1}$ a replacement address set by replacement address program circuit 231. When at an active state in which precharge control signal $\phi_P$ is at an inactivated level, it outputs an external Y address by active signal $\phi_{A1}$.

A Y decoder circuit 202 includes a decoding portion 221 for inputting and decoding an output address signal of replacement address detection control circuit 207, and a control portion 222. Y decoder circuit 202 has a function to generate a control signal $\phi_{CC}$ which turns off transistor Q1 at normal memory cell column of memory cell array portion 201 corresponding to the replacement address when precharge control signal $\phi_P$ is at activated level.

At the time of precharging when precharge control signal $\phi_P$ is at "H" level, the output of decoding portion 221 in Y decoder circuit 202 corresponding to the replacement address, that is, control signal $\phi_C$ attains "L" level and transistor Q1 of the normal memory cell column with a defective portion is turned off such that bit lines DL1, $\overline{DL1}$ at this memory cell column is not precharged.

For instance, even when word line WL and bit line DL1 are short-circuited, no leakage current flows from precharging circuit to the word line, so that it is possible to prevent the increase of power consumption.

As described above, in a conventional semiconductor memory device, there has been the following problems when there is a defect owing to short-circuit between the bit line and the word line.

First, as shown in the first conventional example, a leakage current is generated from the short-circuited bit line via the word line precharge operation of the bit line pair is performed during standby operation, such that power consumption of the semiconductor memory device is increased.

Secondly, even in the second conventional example which deals with the above-described problem, it is necessary to arrange the following two interconnections to every memory cell column.

The first interconnection transmits a column selecting signal from the column selecting circuit (i.e., Y decoder) for controlling the connection between the sense amplifier of the memory cell column and the corresponding input/output lines.

The second interconnection transmits the signal $\phi_{CC}$ which controls transistor Q1 for cutting off the transmission of precharging control signal $\phi_P$ to the precharging circuit. Accordingly, in a semiconductor memory device having an improved integrity, layout of the above interconnections was difficult.

Thirdly, when there is a slight leakage path which would not cause the false operation but would lead to an increase in power consumption during the standby operation, there does not exist any effective testing method for detecting a memory cell column and the like having this slight leakage path.

SUMMARY OF THE INVENTION

It is an object of the present invention to provide a semiconductor memory device having a circuit structure which can cut off the path in which leakage current flows when there is a failure due to short-circuit between a bit line and a word line.

It is another object of the present invention to provide a semiconductor memory device in which a redundant circuit can be formed and which is advantageous for reduction of layout area without increase of extra interconnections even when the memory cells and the like are miniaturized.

It is still another object of the present invention to provide a semiconductor memory device in which the possibility of increase in power consumption during standby operation is reduced even when failure due to short-circuit has occurred during the process of manufacturing.

It is still another object of the present invention to provide a semiconductor memory device in which an operation test which easily detects a memory cell column and the like having a slight leakage path therein is possible, and in which reduction of power consumption during the standby operation is possible by replacing such a memory cell column and the like having a slight leakage path therein by a redundant circuit.

Briefly speaking, the present invention is a semiconductor memory device including a memory cell array, a precharge potential supply interconnection, a column selecting circuit, and a bit line equalizing circuit.

The memory cell array includes a plurality of word lines, a plurality of bit line pairs crossing the plurality of word lines, and a plurality of memory cells connected to these word lines and the bit line pairs. The precharge potential supply interconnection supplies precharge potential of the bit line pairs. The column selecting circuit exist corresponding to the bit line pairs and is responsive to external address signal to output a column selecting signal for selecting the corresponding bit line pair. Each column selecting circuit includes a standby state setting circuit which sets the column selecting signal during the standby period to either one of first and second potential level depending on whether there is a defective bit in the bit line pair or not. The bit line equalizing circuit exist corresponding to the bit line pair, and opens or closes the connection between the bit line pair and a precharge power supply in response to external bit line equalizing signal when the column selecting signal is at the first potential level and renders the connection non-conductive when the signal is at the second potential level.

According to another aspect of the present invention, a semiconductor memory device includes a memory cell array, a precharge potential supply interconnection, a power supply interconnection, a power supply interconnection potential setting circuit, and a bit line equalizing circuit.

The memory cell array includes a plurality of word lines, a plurality of bit line pairs crossing the plurality of word lines, and a plurality of memory cells connected to these word lines and the bit line pairs. The precharge potential supply interconnection supplies precharge potential of the bit line pair. The power supply interconnection is arranged parallel to the bit line pair and there is at least one power supply interconnection for every set of bit line pairs. The power supply interconnection supplies a power supply potential. Power supply interconnection potential setting circuit exist in every power supply interconnection and sets the supplied potential at either one of first and second potentials depending on whether there is a defective bit in the corresponding bit line pair. Bit line equalizing circuit exists corresponding to the bit line pair and opens or closes the connection between the bit line pair and the precharging power supply in response to external bit line equalizing signal when the power supply interconnection potential is the first potential and renders this connection non-conductive when the power supply interconnection potential is at the second potential level.

According to still another aspect of the present invention, a semiconductor memory device includes a memory cell array, a first power supply interconnection, a second power supply interconnection, a column selecting circuit, a switching circuit, and a column selecting signal interconnection.

The memory cell array includes a plurality of word lines, a plurality of bit line pairs crossing the plurality of word lines, and a plurality of memory cells connected to these word lines and bit line pairs. The first power supply interconnection is arranged in parallel to the bit line pair, and there is at least one first power supply interconnection in every set of bit line pairs. This first power supply interconnection supplies a first power supply potential. The second power supply interconnection is arranged parallel to the first power supply interconnection to form a pair, and supplies a second power supply potential. The column selecting circuit exists corresponding to the bit line pair, and is driven by first and second power supply potentials for outputting the column selecting signal responsive to external address signal to select a corresponding bit line pair.

The switching circuit is responsive to the column selecting signal and opens or closes the connection between the bit line pair and an input/output data line for conducting the bit line pair potential externally. The column selecting signal interconnection is arranged parallel to the bit line pair and provides connection between column selecting circuit and the switching circuit. The distance between the first power supply interconnection and the column selecting signal interconnection is larger than the distance between the second power supply interconnection and the column selecting signal interconnection.

According to yet another aspect of the present invention, a semiconductor memory device includes a memory cell array, a column selecting circuit, a power supply interconnection, a potential control circuit and a sense amplifier.

The memory cell array includes a plurality of word lines, a plurality of bit line pairs crossing the plurality of word lines, and a plurality of memory cells connected to the word lines and the bit lines. The row selecting circuit selects a word line in accordance with a row address signal. The power supply interconnection is arranged in parallel to the bit line pair, and there is At least one power supply interconnection for every set of the bit line pairs so as to supply power supply potential. The potential control circuit is arranged corresponding to the power supply interconnection. The sense amplifier is arranged corresponding to the bit line pairs and potential is supplied thereto from the power supply interconnection in response to activation of a sense amplifier activation signal so as to amplify the potential difference of the bit line pair corresponding to the data of the memory cell connected to the selected word line. The potential control circuit includes an isolating circuit to render the power supply interconnection to an electrically floating state for a prescribed period after the activation of the sense amplifier activation signal.

Accordingly, it is a main advantage of the present invention that, since precharge potential supply interconnection and a bit line pair are electrically disconnected during the standby period with the bit line pair having a defective bit therein, it is possible to prevent generation of leakage current from the precharge potential supply interconnection to the word line and to suppress the increase in current consumption.

It is another advantage of the present invention that, since connection between precharge potential supply interconnection and the bit line pair is cut off according to the first power supply interconnection potential during the standby period when there is a defective bit in the bit line pair, generation of leakage current from the precharge potential supply interconnection to the word line is prevented and increase in current consumption is suppressed.

It is still another advantage of the present invention that, since the distance between the first power supply interconnection and the column selecting signal interconnection is set larger than the distance between the second power supply interconnection and the column selecting signal interconnection, possibility of generation of leakage current due to failure owing to short-circuit between the first power supply interconnection and the column selecting signal interconnection can be reduced.

It is a further advantage of the present invention that, since the power supply interconnection is electrically floating during the period of test mode, influence of a slight leakage current existing in this power supply interconnection can be made apparent so that it would be possible to detect a memory cell column having such slight leakage current therein.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a circuit diagram showing the principal portions of a structure of a semiconductor memory device according to a first conventional example.

DESCRIPTION OF THE PREFERRED EMBODIMENTS

[First Embodiment]

Figure 1:
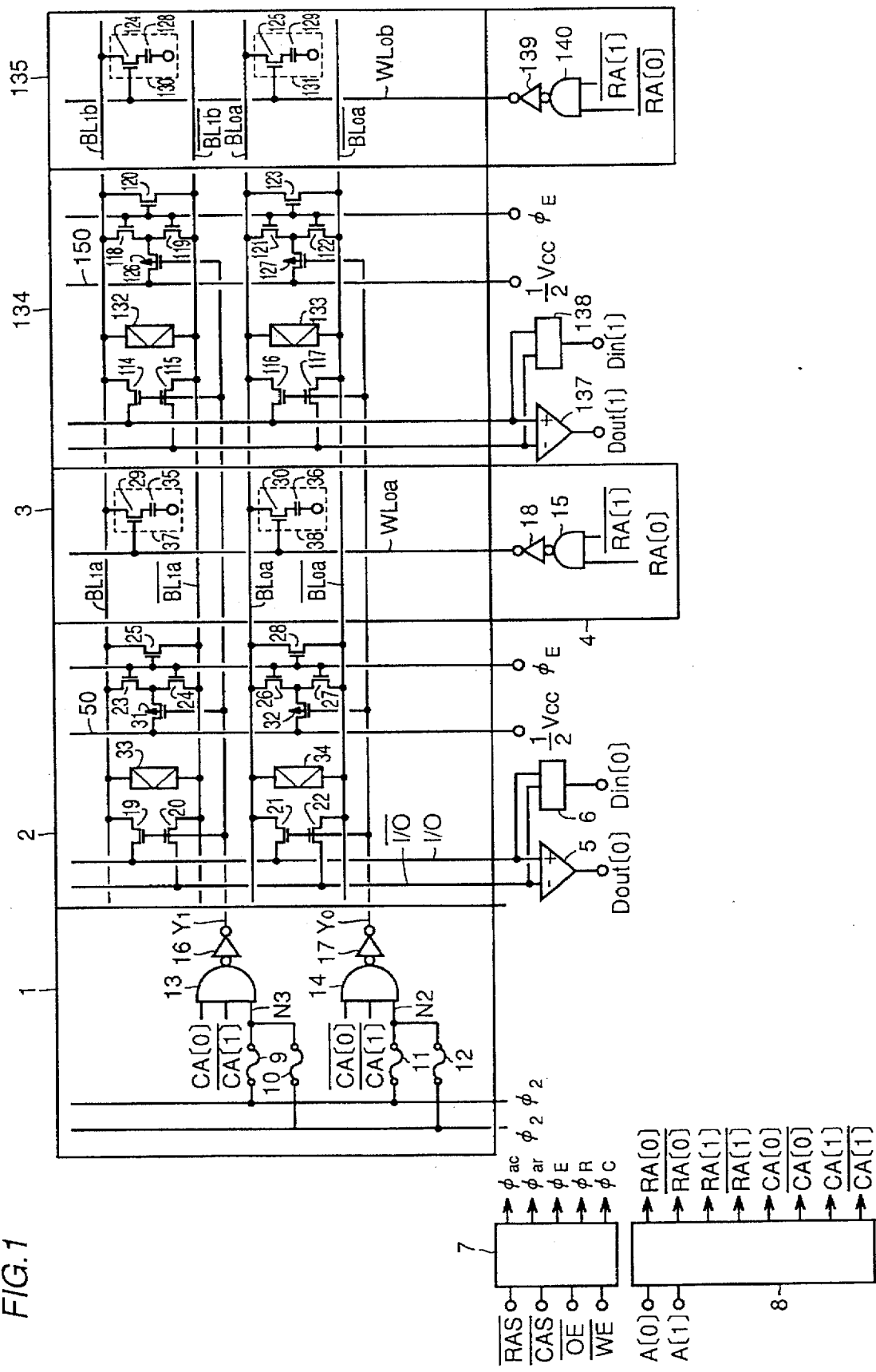
FIG. 1 is a circuit diagram showing the principal portions in a structure of a semiconductor memory device according to a first embodiment of the present invention.

FIG. 1 is a circuit diagram showing the principal portions in the structure of a semiconductor memory device 100 according to a first embodiment of the present invention.

Figure 12:
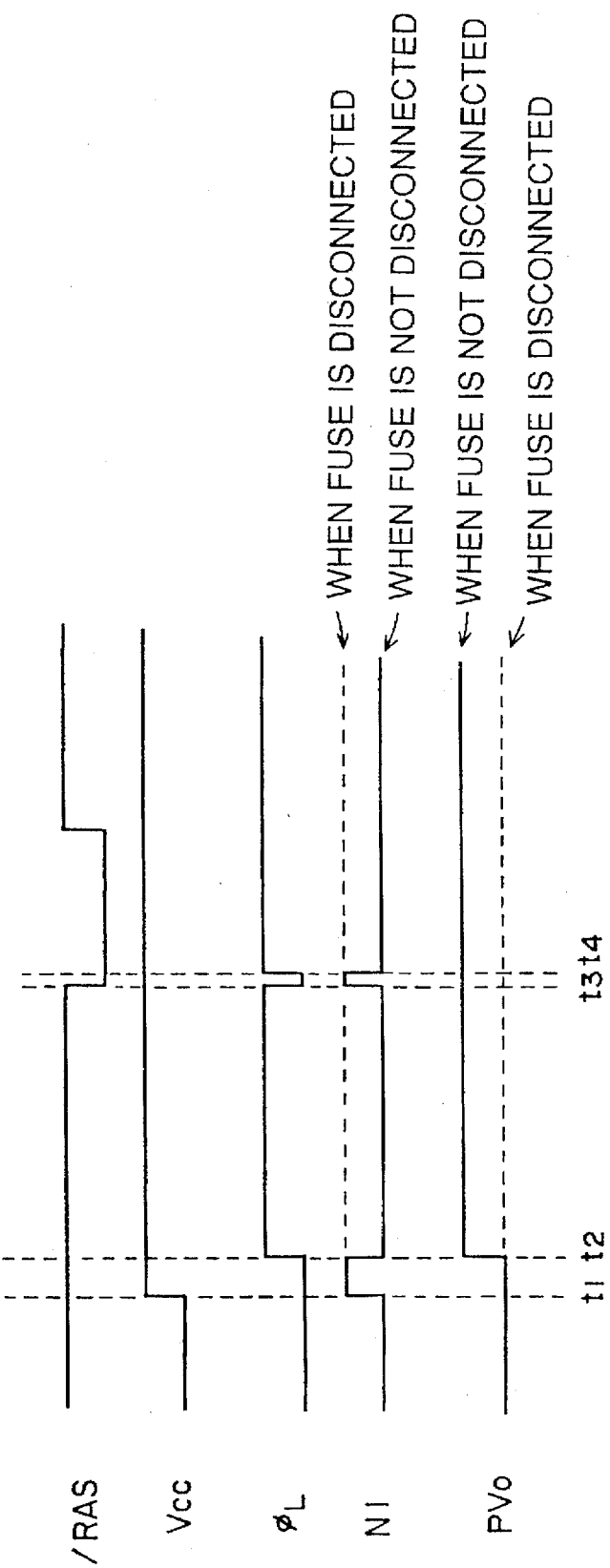
FIG. 12 is a timing chart for illustrating the operation of test circuit 70.

For the sake of simplification, there are two input pins and two output pins shown in FIG. 1, and a memory cell corresponds to each of them. A column decoder is shared by two memory cell arrays. In the figure, the portions identical to those of the first conventional example in FIG. 12 are denoted by the same reference characters and description thereof is not given.

The present embodiment differs from the first conventional example in the following points.

First, in a memory cell array control portion 2 and 134, P type MOS transistors 31, 32, 126 and 127 are connected between the connection points of N type MOS transistors 23 and 24, 26 and 27, 118 and 119 as well as 121 and 122 and precharging potential supply interconnection 50 and 150, respectively.

Secondly, the above-described P type MOS transistors 31, 32, 126, 127 have their gates connected to column selecting lines Y0 and Y1 and opening and closing of these transistors are controlled by column selecting signals CSL0 and CSL1.

Thirdly, in a column decoder 1, it is possible to set the signal level of the column selecting signals CSL0 and CSL1 during the standby period by fuse elements 9, 10, 11 and 12.

Figure 2:
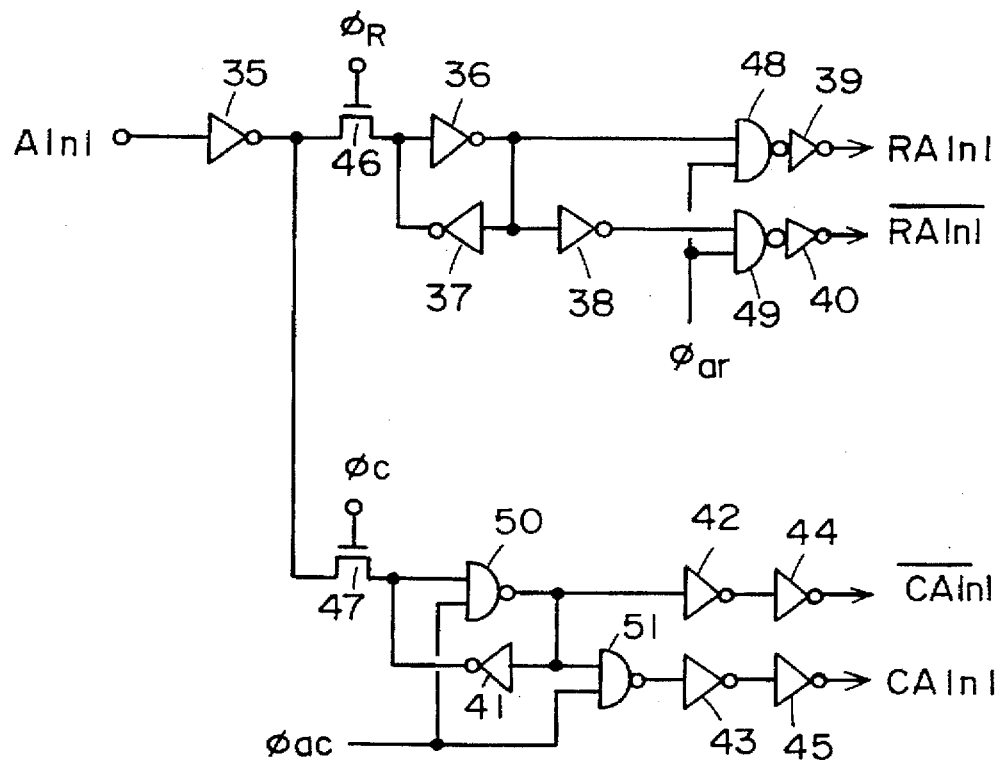
FIG. 2 is a circuit diagram showing a structure of an address buffer circuit according to the first embodiment.

FIG. 2 is a circuit diagram showing an example of a structure of an address buffer circuit 8 in FIG. 1, including one bit.

Referring to FIG. 2, address signal A [n] is input to inverter 35. An output of inverter 35 is connected to latching circuit formed by inverters 36 and 37 through MOS transistor 46 controlled by a row address latching signal $\phi_R$. The output of latch circuit formed by inverters 36 and 37 is input to a logic gate circuit formed by NAND circuits 48 and 49 as well as inverters 39 and 40, controlled by row address activation signal $\phi_{ar}$ to be output as internal row address signals RA [n] and $\overline{RA}$ [n].

Meanwhile, the output of inverter 35 is in connection with latching circuit formed of NAND circuit 50 and inverter 41 controlled by column address activation signal through MOS transistor 47 controlled by column address latching signal $\phi_C$. Owing to the change of column address activation signal $\phi_{ac}$ to "H" level, the latching signal from this latch circuit is output as internal column address signals CA [n], $\overline{CA}$ [n] from the logic gate circuit formed of NAND circuit 51 as well as inverters 42, 43, 44 and 45.

Figure 3:
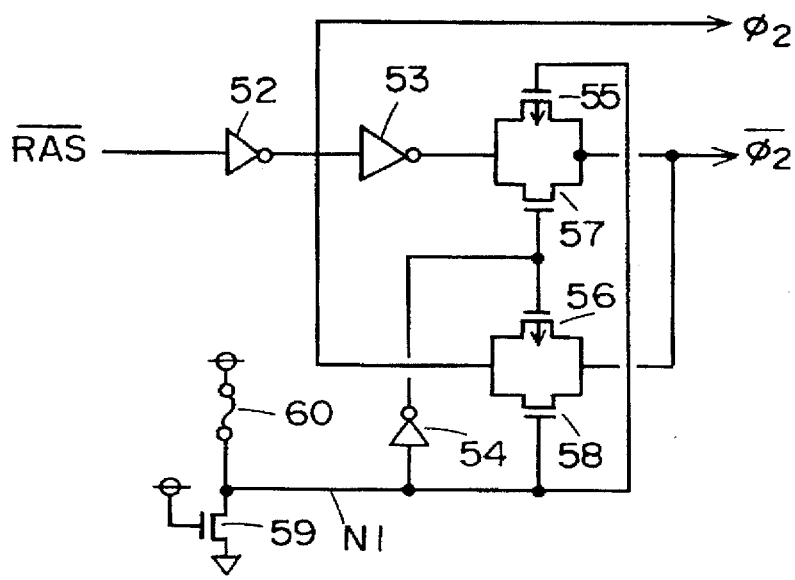
FIG. 3 is a circuit diagram showing a structure of a column decoder driver circuit according to the first embodiment.

FIG. 3 is a circuit diagram showing a circuit for generating $\phi2$ and $\overline{\phi2}$ in FIG. 1.

Figure 4:
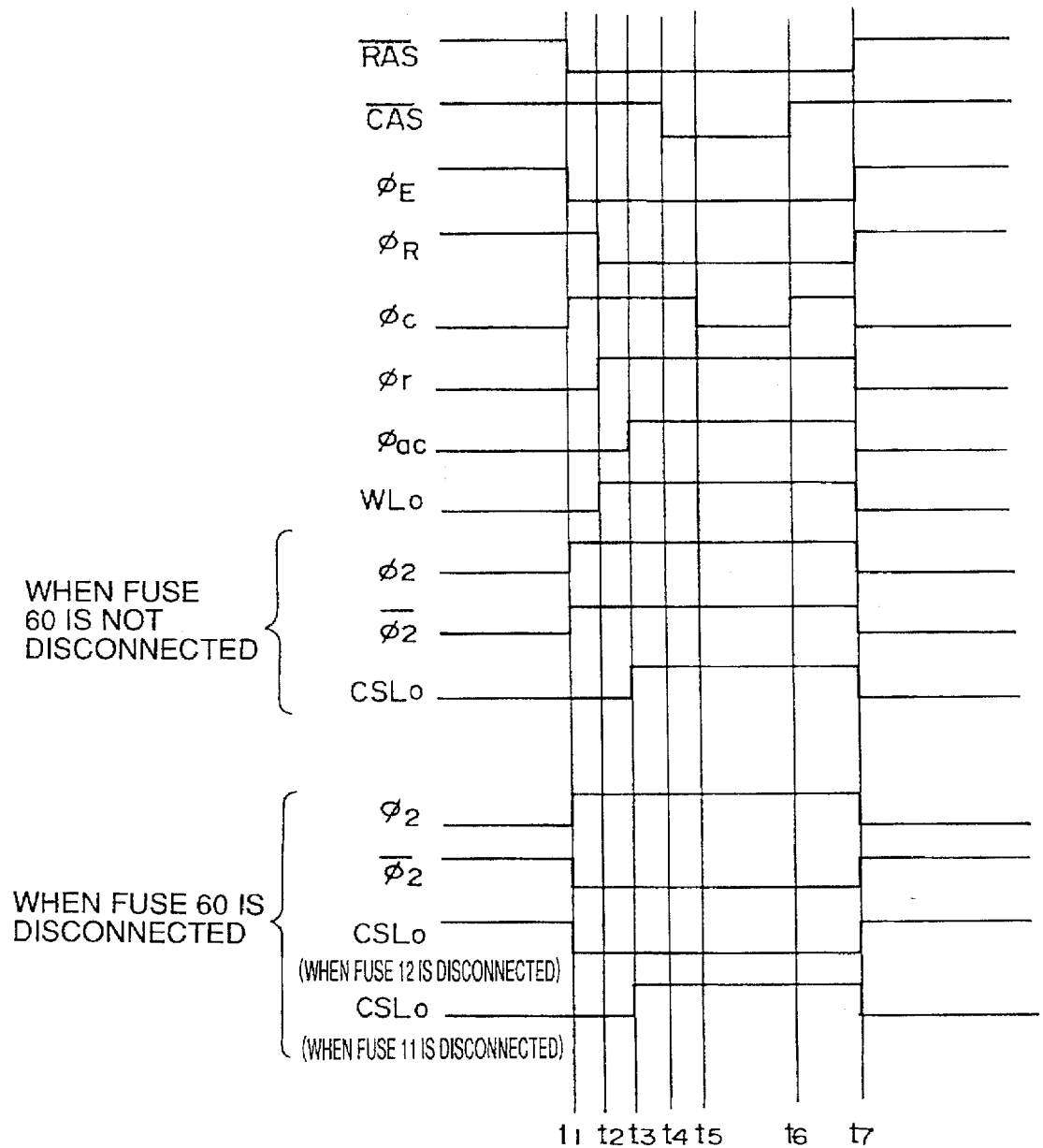
FIG. 4 is a timing chart illustrating the operation of the first embodiment.

Operation of the circuit will be described in the following, with reference to the circuit diagram of FIG. 3 and timing chart of FIG. 4.

The operation of equalizing signal $\phi_E$, row address latching signal $\phi_R$, column address latching signal $\phi_C$, row address activation signal $\phi_{ar}$ and column address activation signal $\phi_{ac}$ are similar to those of the conventional example.

First, the case in which there is no failure due to short-circuit between bit line BL0a and word line WL0a will be described.

Here, fuse 60 of FIG. 3 is not disconnected. Thus, potential of node N1 is made higher because the channel resistance of the transistor 59 is set high. Accordingly, transistors 56 and 58 are rendered conductive while transistors 55 and 57 are rendered non-conductive such that signal $\overline{\phi 2}$ as well as signal $\phi 2$ become an inverted waveform of signal $\overline{RAS}$.

Therefore, during the period in which signal $\overline{RAS}$ is at "H" level, an input terminal N2 of NAND gate 14 in column decoder 1 of FIG. 1 is at "L" level. Thus, column selecting line Y0 receives a column selecting signal CSL0 of the output of inverter 17 and attains "L" level.

When signal $\overline{RAS}$ attains "L" level and column address activation signal $\phi_{ac}$ at time t3 attains "H" level, column selecting line Y0 attains "H" level with input address being A [0]=0 and A [1]=0, to connect bit line pair BL0a, $\overline{BL0a}$ to input/output lines $\overline{I/O}$, I/O.

A differential amplifier 5 amplifies the potential difference between the paired I/O lines to output the readout data to an output pin $D_{out}$ [0].

Next, a case in which there is a failure due to short-circuit between bit line BL0a and word line WL0a and there is no failure due to short-circuit between bit lines BL1a to BL3a as well as bit lines $\overline{BL1a}$ to $\overline{BL3a}$ and word line WL0a will be described in the following.

Here, fuse 60 of FIG. 3 is disconnected. Then, node N1 is discharged to attain "L" level by transistor 59. Accordingly, transistors 55 and 57 are rendered conductive while transistors 56 and 58 are rendered non-conductive, and signal $\phi 2$ is made into an inverted waveform of signal $\overline{RAS}$ and signal $\overline{\phi 2}$ would obtain the same waveform as that of signal $\overline{RAS}$.

Node N2 is set at the potential of $\overline{\phi 2}$ by disconnecting a fuse element 12 of the column decoder for driving column selecting line Y0 which selects bit lines BL0a, $\overline{BL0a}$ with failure due to short-circuit. A node N3 is set at the potential of $\phi 2$ by disconnecting fuse element 9 of the column decoder for driving column selecting lines Y1 to Y3 which selects bit lines BL1a to BL3a and $\overline{BL1a}$ to $\overline{BL3a}$ with no failure due to short-circuit.

When a row strobe signal $\overline{RAS}$="H" level, signal $\phi 2$ is at "L" level so that column selecting lines Y1 to Y3 would be at "L" level as in the first conventional example.

In addition, since column address activation signal $\phi_{ac}$="L" level, internal address signals $\overline{CA}$ [n], CA [n] are at "H" level. Meanwhile, $\overline{\phi 2}$ is at "H" level. Accordingly, column selecting line Y0 attains "H" level. Thus, since P channel MOS transistor 32 is rendered non-conductive, there is no leakage current flowing to word line WL0a from interconnection 50 supplying $V_{CC}/2$ potential even when there is a failure due to short-circuit between bit line BL0a and word line WL0a.

When row strobe signal $\overline{RAS}$ attains "L" level and column address activation signal $\phi_{ac}$ at time t3 attains "H" level, signals $\phi 2$="H", CA [0]="H", $\overline{CA}$ [1]="H" when input address is A [0]=1 and A [1]=0, for example, such that column selecting line Y1 would be at "H" level and bit lines BL1a, $\overline{BL1a}$ would be connected to input/output lines I/O, $\overline{I/O}$.

Meanwhile, although NAND gate 14 which drives column selecting line Y0 to select bit lines BL0a, $\overline{BL0a}$ with a failure due to short-circuit is in connection with signal $\overline{\phi 2}$, this signal $\overline{\phi 2}$ is at "L" level, so that column selecting line Y0 is maintained at "L" level.

Accordingly, bit lines BL0, $\overline{BL0}$ with failure due to short-circuit is disconnected from input/output lines I/O, $\overline{I/O}$. Thus, the data of bit lines BL1a and $\overline{BL1a}$ selected by column selecting line Y1 is read out to input/output lines I/O and $\overline{I/O}$ without interference with bit lines BL0a and $\overline{BL0a}$ having failure due to short-circuit.

Differential amplifier 5 amplifies and reads out the potential difference between the paired input/output lines I/O and $\overline{I/O}$ and outputs the data to output pin $D_{out}$ [0].

Although the above description has been made for the readout operation, it is possible to operate the normal bit line pair and the bit line pair with failure due to short-circuit without any interference also in the case of writing operation, in which the data from input pin $D_{in}$ [0] is input through writing circuit 6.

Therefore, in accordance with the present invention, there is no leakage current flowing during the period in which row strobe signal $\overline{RAS}$ is at "H" level (i.e., when at standby state), even when there exists a failure due to short-circuit between the bit line and the word line. Thus, it is possible to prevent the current consumption during the standby state from exceeding the specification value resulting in a defective product.

[Second Embodiment]

In the structure of the first embodiment shown in FIG. 1, transistors 31, 32, 126 and 127 inserted for cutting off the path between a defective bit line and an interconnection for supplying an equalizing potential $V_{CC}/2$ had their gates controlled by column selecting signal $Y_i$ (where i=0, 1). However, in the structure of the second embodiment shown in FIG. 5, control is provided by the power supply interconnection formed over memory cell array.

Figure 5:
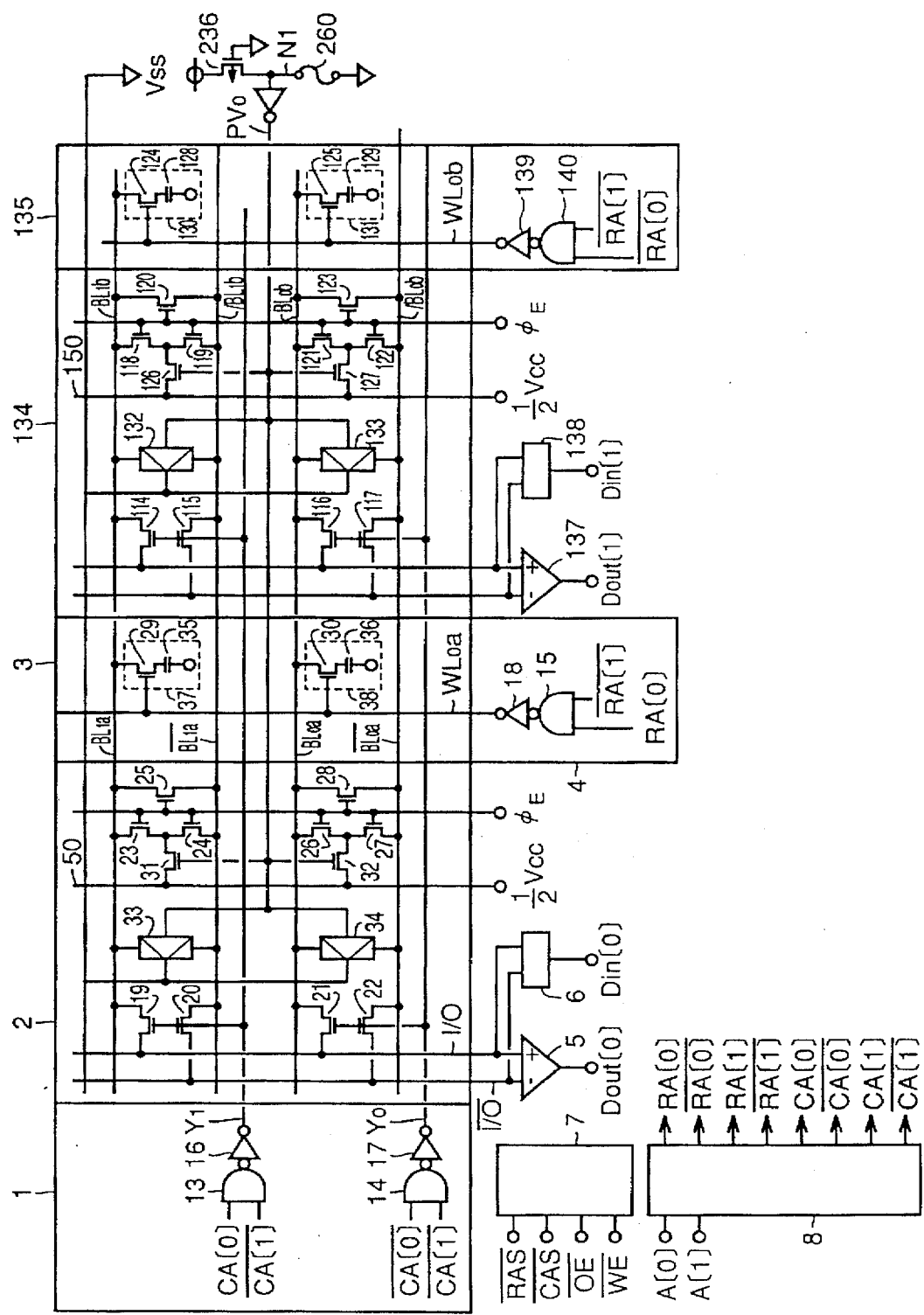
FIG. 5 is a circuit diagram showing the principal portions of a structure of a semiconductor memory device according to a second embodiment of the present invention.

FIG. 5 is a circuit diagram showing the structure of a semiconductor memory device 100 according to the second embodiment of the present invention. In the figure, the portions which are identical to those of the first conventional example are denoted by the same reference characters and description thereof is not repeated.

The difference between the second embodiment and the first embodiment is as follows.

First of all, in the structure of the second embodiment, an N channel Mos transistor 31 and the like are located between the connection node of N type MOS transistors 23 and 24 and the like in which their gate potentials are controlled by equalizing signal $\phi_E$ and precharge potential supply interconnection 50 and the like.

Secondly, the gates of the above-mentioned N channel MOS transistor 31 and the like are in connection with interconnection PV0 for supplying power supply potential in the structure of the second embodiment.

Figure 6:
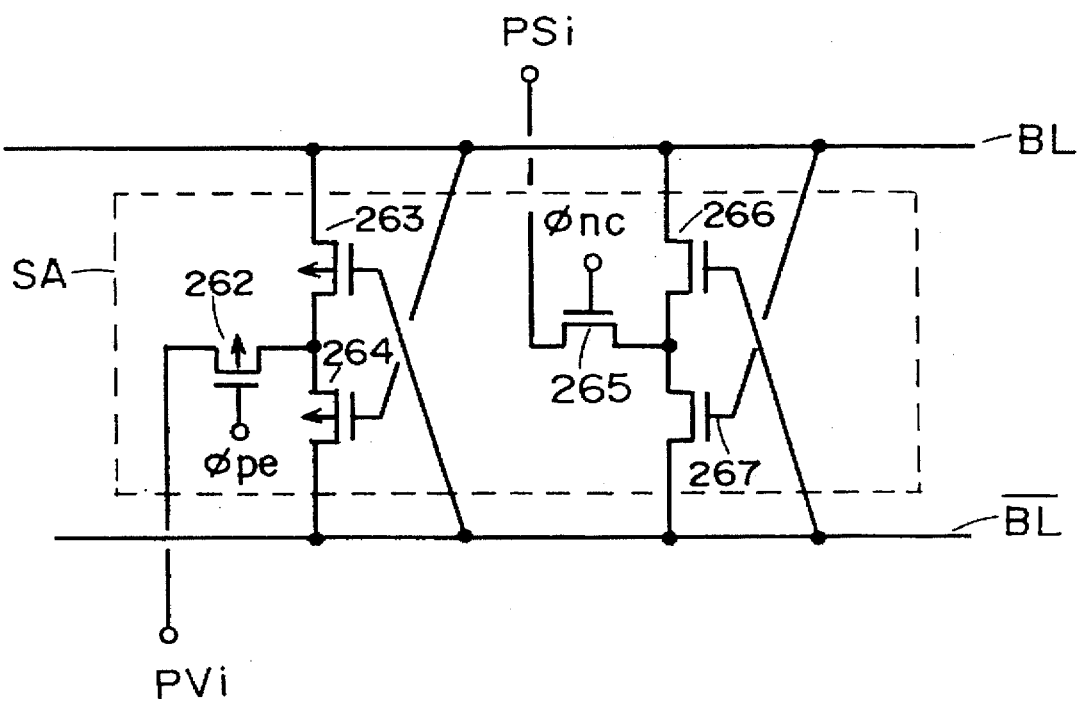
FIG. 6 is a circuit diagram showing a structure of a sense amplifier according to the second embodiment.

Thirdly, the potential of power supply potential supply interconnection PV0 is set by fuse element 260. FIG. 6 is a circuit diagram showing an example of a structure including sense amplifiers 33, 34, 132 and 133. In FIG. 6, a sense amplifier SA includes P channel MOSFETs 262 to 264 and N channel MOSFETs 265 to 267. Connection between power supply potential supply interconnection $PV_i$ and P channel MOS transistors 263, 264 is provided through P channel MOSFET in which the gate potential is controlled by sense amplifier activation signal $\phi_{pe}$. Ground potential supply interconnection $PS_i$ and N channel MOS transistors 266, 267 are brought into contact through N channel MOS transistor 265 in which the gate potential is controlled by sense amplifier activation signal $\phi_{ne}$.

Referring to FIG. 5, an interconnection PV0 for supplying power supply potential and interconnection PS0 for supplying ground potential are arranged between column selecting lines Y0 and Y1. Since the channel resistance of the transistor 236 in FIG. 5 is set at a large value, node N1 would be at "L" level when fuse 260 is not disconnected.

Accordingly, interconnection PS0 supplies ground potential to sense amplifiers 33, 34, 132 and 133 while interconnection PV0 supplies power supply potential to sense amplifiers 33, 34, 132 and 133.

The case in which there is a failure due to short-circuit between bit line BL0a and word line WL0a will be described in the following.

Here, fuse 260 is disconnected. Then, node N1 would be charged to $V_{CC}$ by transistor 236 so that interconnection PV0 is discharged to a ground potential by inverter 240. Therefore, the gate potential of transistor 32 would attain "L" level such that transistor 32 would be rendered non-conductive. Thus, leakage current to word line WL0a from interconnection 50 which supplies $V_{CC}/2$ potential through failure due to short-circuit between bit line BL0a and word line WL0a would be cut off.

When there is no failure due to short-circuit between the bit line and the word line, fuse 260 is maintained as it is. Here, sense amplifiers 266 to 269 are provided with power supply voltage and ground voltage via interconnections PV0 and PS0, as described above. Address buffer circuit 8 has a structure identical to that of the conventional address buffer 8 shown in FIG. 12.

The operation of the circuit will now be described with reference to the timing chart of FIG. 12. Before time t1, row strobe signal $\overline{RAS}$ is at "H" level and semiconductor memory device 100 is at a standby state. At this time, equalizing signal $\phi_E$ is at "H" level so that transistors 25 to 28 and 68 to 123 are rendered conductive. Since interconnection PV0 is at power supply voltage, transistors 31, 32, 126, and 127 are rendered conductive. Accordingly, bit lines BL0a, BL1a, BL0b, BL1b, $\overline{BL0a}$, $\overline{BL1a}$, $\overline{BL0b}$ and $\overline{BL1b}$ are charged to $V_{CC}/2$.

Figure 10:
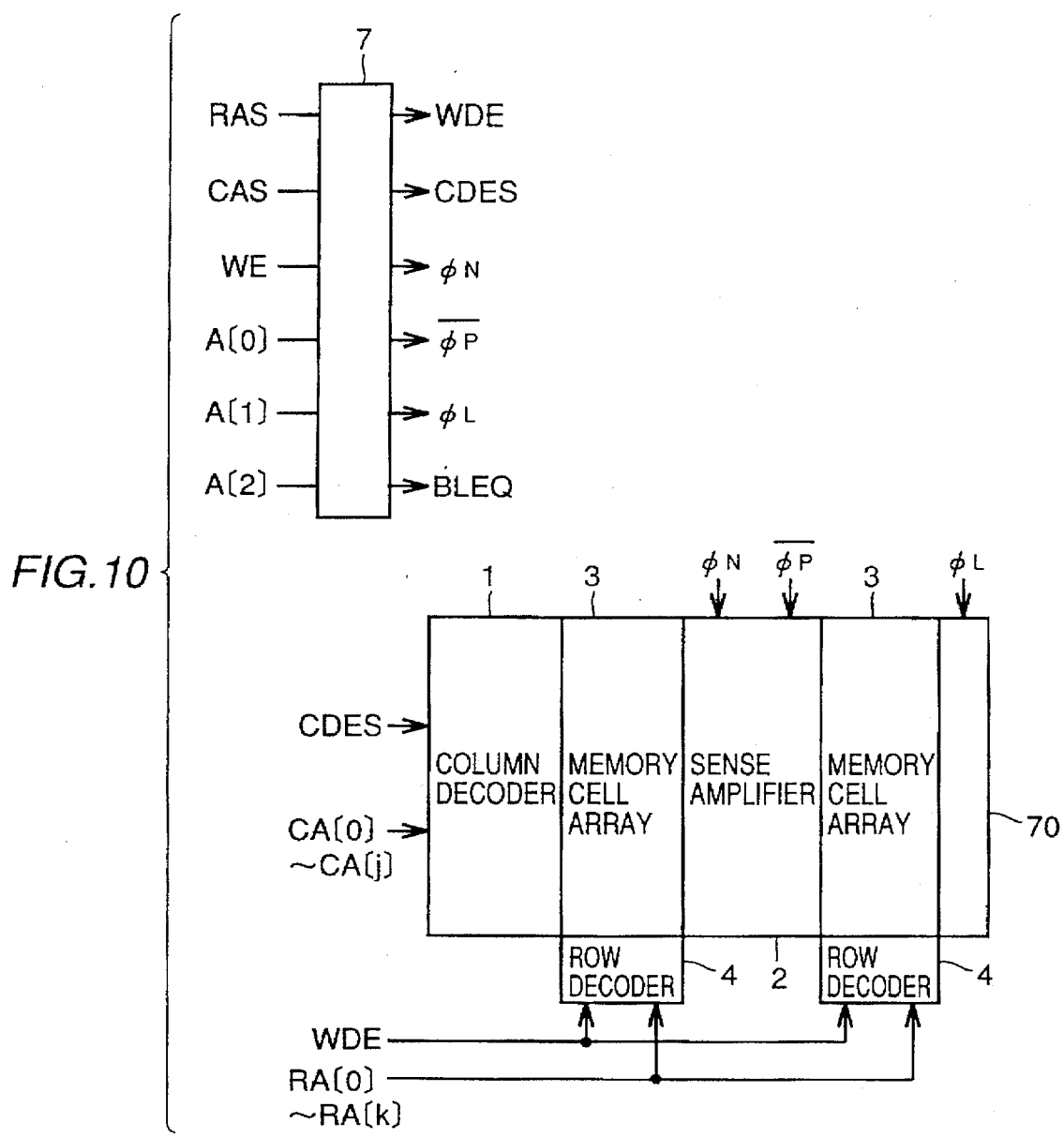
FIG. 10 is a block diagram showing the principal portions of control circuit 7 and memory cell 3 of the semiconductor memory device according to the fourth embodiment.

When row strobe signal $\overline{RAS}$ attains "L" level at time t1, signal $\phi_R$ attains "L" level at time t2, and thus the row address input to address pins A [0], A [1] are held in the latch circuit formed by inverters 83 and 84 shown in FIG. 10.

In addition, since signal $\phi_{ar}$ attains "H" level at time t2, internal row address signals RA [n] and $\overline{RA}$ [n] are output. When input row addresses are A [0]=0 and A [1]=0 according to internal row address signals RA [n] and $\overline{RA}$ [n] (where n=0, 1), word line WL0a attains "H" level. Then, the data held in memory cell 38 is read out to bit line BL0. Since sense amplifier 34 is provided with power supply voltage by interconnection PV0 and provided with ground voltage by interconnection PS0, it amplifies the data readout to the bit line when sense amplifier activation signal $\phi_{pe}$ attains "L" level and sense amplifier activation signal $\phi_{ne}$ attains "H" level.

If column strobe signal $\overline{CAS}$ attains "L" level at time t4, column address latching signal $\phi_C$ attains "L" level at time t5 so that column address input to address pins A [0] and A [1] is held at the latch circuits formed by 88 and 89.

In addition, since column address activation signal $\phi_{ac}$ attains "H" level at time t3, internal column address signals CA [n] and $\overline{CA}$ [n] are output.

When input column addresses are A [0]=0 and A [1]=0 according to internal column address signals CA [n] and $\overline{CA}$ [n] (where n=0, 1), column decoder 1 changes column selecting line Y0 to "H" level.

Accordingly, transistors 21 and 22 are rendered conductive and data at bit lines BL0a and $\overline{BL0a}$ are read out to input/output lines I/O and $\overline{I/O}$. Differential amplifier 5 amplifies the potential difference between the paired input/output lines and outputs the data to output pin $D_{out}$ [0].

Although above description has been made for the structure in which the gate potential of N channel MOS transistors 31, 32, 126 and 127 are controlled by power supply interconnection PV0, it is also possible to employ a structure in which the transistors are P channel MOS transistors controlled by ground interconnection PS0.

Thus, generation of leakage current owing to failure due to short-circuit between the bit line and the word line can be prevented by a structure employing an interconnection which supplies power supply voltage or ground voltage to the sense amplifier to control the gate potential of the transistors inserted in order to cut off the path between a defective bit line and an interconnection which supplies $V_{CC}/2$ as equalizing potential.

[Third Embodiment]

In semiconductor memory device 100 of FIG. 1, column decoder 1 is employed for selecting both memory cell blocks 3 and 135, and therefore, column selecting lines Y0 to Y3 passes above memory cell array 3.

Figure 7:
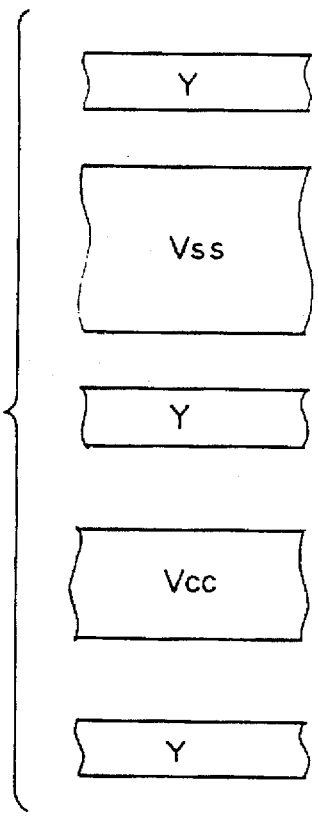
FIG. 7 is a plan view showing a pattern in an example of a third embodiment according to the present invention.
Figure 8:
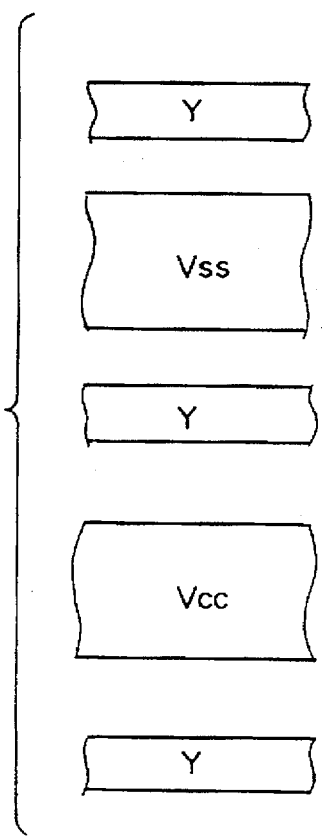
FIG. 8 is a plan view showing a pattern of another example in the third embodiment of the present invention.

An example of the layout of column selecting lines Y0 to Y3 on memory cell array 3 as well as power supply interconnection $V_{CC}$ and ground interconnection $V_{SS}$ is shown in FIGS. 7 and 8. In FIG. 7, intervals between column selecting lines Y are made constant and power supply interconnection $V_{CC}$ is made narrower than ground interconnection $V_{SS}$ such that interval between power supply interconnection $V_{CC}$ and column selecting line Y is larger than interval between ground interconnection $V_{SS}$ and column selecting line Y.

Meanwhile, in FIG. 8, the widths of power supply interconnection $V_{CC}$ and ground interconnection $V_{SS}$ are the same, and the interval between power supply interconnection $V_{CC}$ and column selecting line Y is made larger than interval between ground interconnection $V_{SS}$ and column Selecting line Y by displacing the position of column selecting line Y.

Referring to FIGS. 7 and 8, power supply interconnection $V_{CC}$ and ground interconnection $V_{SS}$ are arranged between column selecting lines Y. During standby in which row strobe signal $\overline{RAS}$ is at "H" level, the potential of column selecting line Y is at "L" level. Accordingly, even when there is a failure due to short-circuit between column selecting line Y and ground interconnection $V_{SS}$ which occurs owing to particles or the like during the process of manufacturing, no leakage current flows between these column selecting line Y and ground interconnection $V_{SS}$ during standby. On the contrary, if there is failure due to short-circuit between column selecting line Y and power supply interconnection $V_{CC}$, leakage current would flow during the time of standby. Accordingly, in the layout shown in FIGS. 7 and 8, possibility of generation of leakage current during standby period owing to the above-described failure due to short-circuit can be reduced by setting the distance between column selecting line Y and power supply interconnection $V_{CC}$ such that it is larger than the distance between column selecting line Y and ground interconnection $V_{SS}$.

[Fourth Embodiment]

Figure 9:
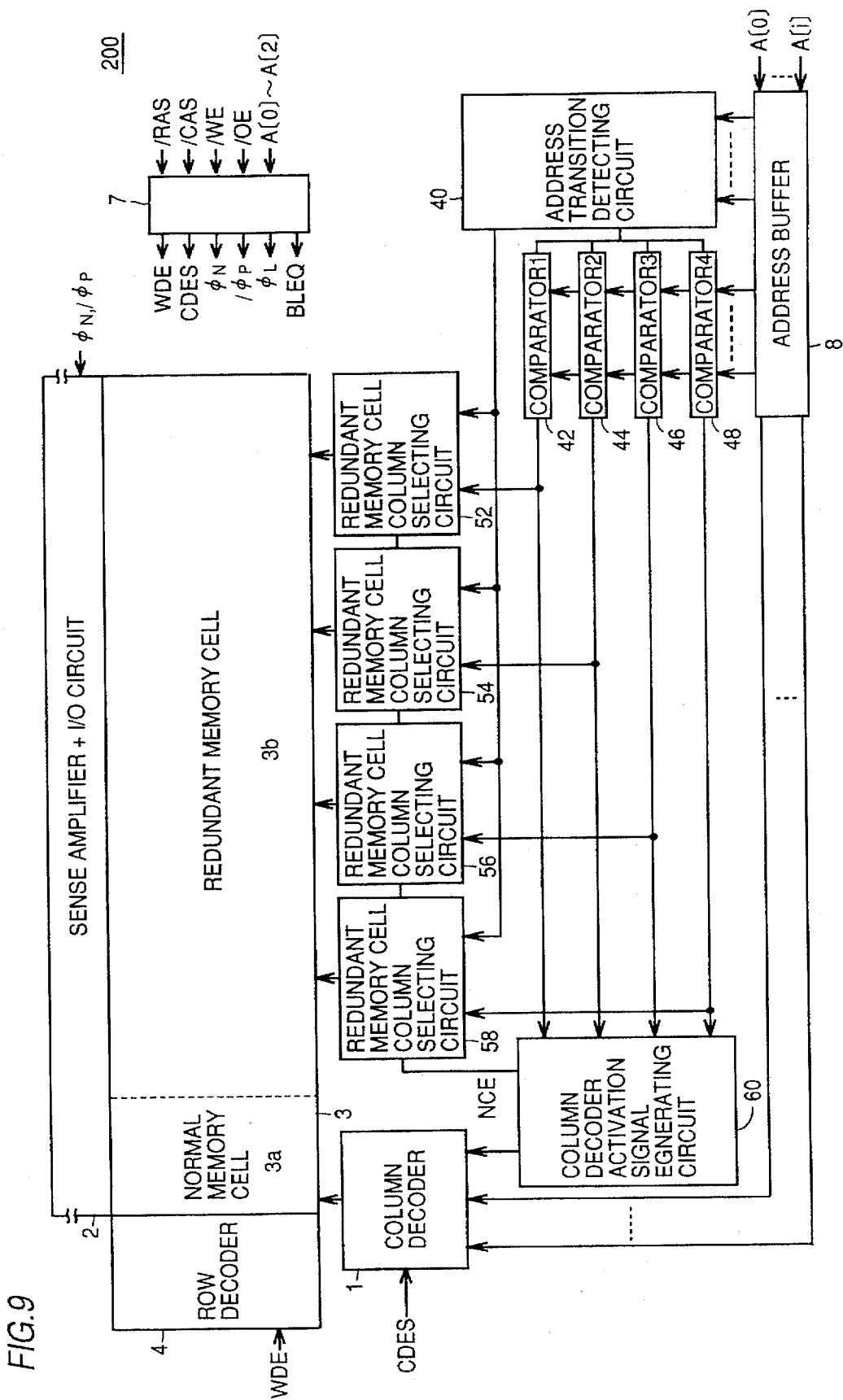
FIG. 9 is a schematic block diagram showing a structure of a semiconductor memory device 200 according to a fourth embodiment.

FIG. 9 is a block diagram showing the principal portions of the structure of a semiconductor memory device 200 in accordance with a fourth embodiment of the present invention.

Referring to FIG. 9, semiconductor memory device 200 includes a control circuit 7 which receives external control signals $\overline{RAS}$, $\overline{CAS}$, $\overline{OE}$ and $\overline{WE}$ applied via an external control signal input terminal to generate an internal control signal, a memory cell array 3 in which memory cells are arranged in rows and columns, an address buffer circuit 8 which receives external address signals A0–Ai applied via an address signal input terminal to generate internal row address signals RA [0], $\overline{RA}$[0], ... RA [j], RA [j] and internal column address signals CA [0], CA [0] ... CA [k], CA [k] under the control of control circuit 7, and a row decoder 4 which is activated under the control of circuit 7 to decode the internal row address signals applied from address buffer circuit 8 and to select a row (a word line) of memory cell array 3.

Signal $\overline{WE}$ provided to control circuit 7 is a write enable signal for designating the writing of data. Signal $\overline{OE}$ is an output enable signal for designating data output. Signal $\overline{RAS}$ is a row address strobe signal for initiating an internal operation of semiconductor memory device 200 and for determining the activation period of this internal operation. When this signal $\overline{RAS}$ is activated, row decoder 4 and the circuit related to the operation for selecting a row of memory cell array 3 are activated. Signal CAS is a column address strobe signal, and activates the circuit for selecting a column of memory cell array 3.

In addition, control circuit 7 generates a row decoder activation signal WDE, a column decoder activation signal CDES, an N type sense amplifier activation signal $\phi_N$, a P type sense amplifier activation signal $\phi$ and a bit line equalizing signal BLEQ.

Memory cell array 3 further includes a normal memory cell array 3a and a redundant memory cell 3b. As will be described later, when there is a defective memory cell in the normal memory cell array 3a, the memory cell column in the normal memory cell array is replaced by a memory cell column in the redundant memory cell array.

Semiconductor memory device 200 further includes an address transition detecting circuit 40 which receives an internal column address signal from address buffer circuit 8 to detect its change and generates an ATD signal for instructing the initiation of precharging operation and the like of internal circuit, comparators 42 to 45 actuated by ATD signal for receiving internal column address signal from address buffer circuit 8 to detect whether the designated internal column address matches with the address of the memory cell column including a defective memory cell which has been stored in advance, redundant memory cell column selecting circuits 52 to 55 activated in response to the result of the comparison of comparators 42 to 45, and a column decoder inactivation circuit 60 which outputs internal control signal NCE for inactivating the operation of column decoder 1 for normal memory cell array 3a when the column address signal matches with either one of the unwanted address columns stored in comparators 42 to 45.

Semiconductor memory device 200 further includes a column decoder 1 which is activated in response to signals CDES and NCE to decode the internal column address signal from address buffer circuit 8 and generate a column selecting signal for selecting a column in memory cell array 3a. As will be described later, two coles, for example, are selected at a time for one column selecting line to which column selecting signal is conducted, and 2-bit data are simultaneously read out from two memory cells belonging to the intersections of the selected row and the two columns selected simultaneously.

Semiconductor memory device 200 further includes a sense amplifier for sensing and amplifying the data of the memory cell connected to the selected row within memory cell array 3, and an I/O circuit for connecting the selected column of memory cell array 3 to a corresponding internal data bus in response to the column selecting signal from column decoder circuit 1.

In FIG. 9, the sense amplifier and the I/O circuit are shown by one block 2. FIG. 10 is a block diagram showing more schematically the peripheral circuit portions of control circuit 7 and memory cell array 3 in semiconductor memory device 200 shown in FIG. 9.

Control circuit 7 receives address signals A [0], A [1] and A [2] in addition to signals $\overline{RAS}$, $\overline{CAS}$ and $\overline{WE}$. As will be described later, when a prescribed test mode is designated by the combination of these signals, control circuit 7 outputs a signal for controlling the potential level of the interconnection supplying a power supply potential to the memory cell array portion, that is, an interconnection potential control signal $\phi_L$.

In the structure of the memory cell array portion shown in FIG. 10, memory cell array 3 is arranged at both sides of sense amplifier+I/O circuit 2 to form a so-called shared type memory cell array arrangement. Test circuit 70 is arranged opposite to the side of column decoder circuit 1, and the operation of test circuit 70 is controlled by signal $\overline{L}$.

Figure 11:
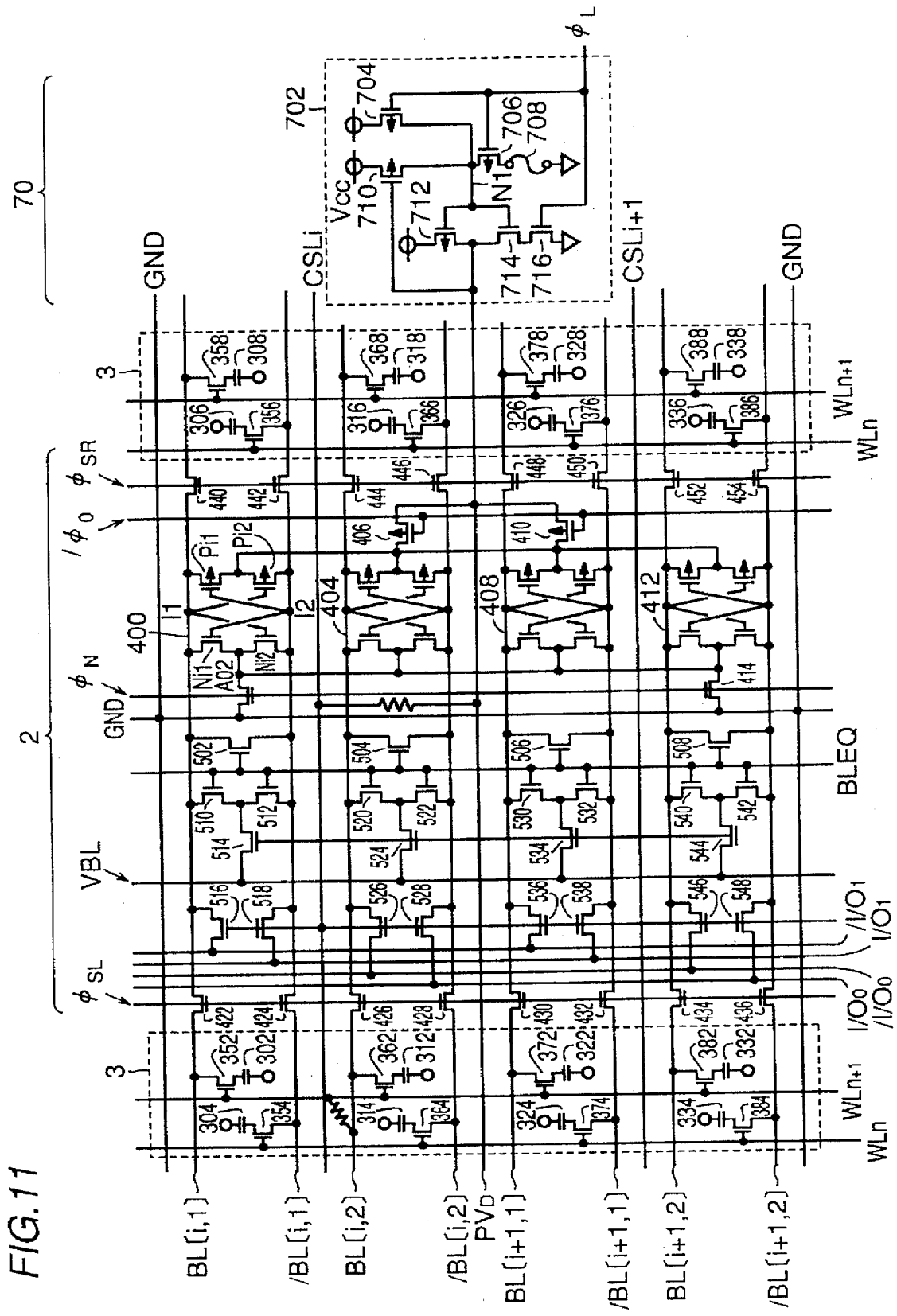
FIG. 11 is a circuit diagram showing a structure of memory cell 3 and test circuit 70.

FIG. 11 is a circuit diagram showing the structure including the memory cell array portion, sense amplifier+I/O circuit 2 and test circuit 70 shown in FIG. 10 in more detail.

The circuit structure shown in FIG. 11 is related to bit line pairs BL [i, 1], $\overline{BL}$ [i, 1] and BL [i, 2], $\overline{BL}$ [i, 2] which are selected simultaneously by column selecting line CSLi, as well as to bit line pairs BL [i+1, 1], $\overline{BL}$ [i+1, 1] and BL [i+1, 2], $\overline{BL}$ [i+1, 2] selected by column selecting line CSLi+1.

Since the circuit structures corresponding to respective bit line pairs are substantially similar, description is first made in the following for the portion of bit line pair BL [i, 1], $\overline{BL}$ [i, 1].

In bit line pair BL [i, 1], $\overline{BL}$ [i, 1], memory cell capacitors 302 to 308 in memory cell array 3 are connected to corresponding bit lines via N channel MOS transistors 352 to 358, respectively.

Sense amplifier 400 provided corresponding to bit line pair BL [i, 1], $\overline{BL}$ [i, 1] includes N channel MOS transistors $N_{i1}$, $N_{i2}$ and P channel MOS transistors $P_{i1}$, $P_{i2}$. N channel MOS transistors $N_{i1}$ and $N_{i2}$ have their sources in connection with ground interconnection GND via N type sense amplifier drive transistors 402 and 414 which are rendered conductive by N type sense amplifier activation signal $\phi_N$. P channel MOS transistors $P_{i1}$ and $P_{i2}$ have their sources in connection with power supply interconnection $PV_0$ which supplies power supply potential $V_{CC}$ via P type sense amplifier drive transistors 406 and 410 which are rendered conductive by P type sense amplifier activation signal $\phi_P$.

The drain of N channel MOS transistor $N_{i1}$, the drain of P channel MOS transistor $P_{i1}$, the gate of N channel MOS transistor $N_{i2}$ and the gate of P channel MOS transistor $P_{i2}$ are connected to bit line BL [i, 1] via N channel MOS transistor 422 driven by signal $\phi_{SL}$ or N channel MOS transistor 440 driven by signal $\phi_{SR}$.

The drain of N channel MOS transistor $N_{i2}$, the drain of P channel MOS transistor $P_{i2}$, the gate of N channel MOS transistor $N_{i1}$ and the gate of P channel MOS transistor $P_{i1}$ are in connection with bit line $\overline{BL}$ [i, 1] via N channel MOS transistor 424 driven by signal $\phi_{SL}$ or N channel MOS transistor 444 driven by signal $\phi_{SR}$.

Accordingly, when signal $\phi_{SL}$ is activated, sense amplifier 400 would be in connection with one side of the bit line pairs BL [i, 1] and $\overline{BL}$ [i, 1] to which memory cell transistors 352 and 354 belong. When signal $\phi_{SR}$ is activated, sense amplifier 400 would be in connection with the other side of the bit line pairs to which memory cell transistors 356 and 358 belong.

Hereinbelow, the node to which N channel MOS transistor $N_{i2}$ and P channel MOS transistor $P_{i2}$ are connected will be referred to as an input node I1, and the node to which N channel MOS transistor $N_{i1}$ and P channel MOS transistor $P_{i1}$ are connected will be referred to as input node I2.

Input nodes I1 and I2 are connected through N channel MOS transistor 502 which receives a bit line equalizing signal BLEQ at its gate. In addition, input nodes I1 and I2 are in connection with interconnection VBL, respectively, via N channel MOS transistors 510 and 512 connected in series between the input nodes which both receives bit line equalizing signal BLEQ at their gates and an N channel MOS transistor 514 which is connected between the connection point of transistors 510, 512 and bit line precharge potential supply interconnection VBL.

The gate of N channel MOS transistor 514 is connected to power supply supplying interconnection PV0 as in Embodiment 2.

Accordingly, when the potential of power supply interconnection $PV_0$ is at "H" level, input nodes I1 and I2 are short-circuited by N channel MOS transistor 502 and are precharged to a precharge potential by being connected to interconnection BVL via transistors 510, 512 and 514 if signal BLEQ is at "H" level.

In addition, input nodes I1 and I2 are in connection with data input/output lines I/O1, $\overline{I/O1}$, respectively, via N channel MOS transistors 516 and 518 which are rendered conductive by column selecting signal CSLi. Therefore, nodes I1 and I2 are connected to data input/output lines I/O1 and $\overline{I/O1}$, respectively, owing to the change of column selecting line CLSi to "H" level.

Since the structure of other bit line pairs BL [i, 2], $\overline{BL}$ [i, 2] to BL [i+1, 2], $\overline{BL}$ [i+1, 2] are similar to the structure described above, description thereof is not provided here.

The four memory cell columns shown in FIG. 11 are selected with column selecting line CSLi or CSLi+1 by every two columns. Power supply line $PV_0$ and ground line GND are arranged alternately between the column selecting lines.

Test circuit 70 includes a potential control circuit 702 for controlling the potential level of power supply line $PV_0$.

Potential control circuit 702 includes a P channel MOS transistor 704 having its source connected to power supply potential $V_{CC}$ and receiving signal $\phi_L$ at its gate, an N channel MOS transistor 706 having its drain connected to the drain of transistor 704 and receiving signal $\phi_L$ at its gate, a fuse element 708 connected between the source of transistor 706 and ground potential $V_{SS}$, and a P channel MOS transistor 710 connected between power supply potential $V_{CC}$ and the drain of N channel MOS transistor 706, having its gate connected to power supply interconnection $PV_0$.

Hereinbelow, the node where the drains of P channel MOS transistors 704, 710 and the drain of N channel MOS transistor 706 are connected is referred to as node N1.

Potential control circuit 702 further includes a P channel MOS transistor 712 connected between power supply potential $V_{CC}$ and power supply interconnection $PV_0$ and having its gate connected to node N1, an N channel MOS transistor 714 having its drain connected to power supply interconnection $PV_0$ and its gate connected to node N1, and an N channel MOS transistor 716 connected between the drain of transistor 714 and ground potential $V_{SS}$ and receiving signal $\phi_L$ at its gate.

As will be described in the following, when there is a defective memory cell in either one of memory cell columns BL [i, 1], $\overline{BL}$ [i, 1] to BL [i+1, 2], $\overline{BL}$[i+1, 2], the potential level of power supply interconnection $PV_0$ is fixed at "L" level by disconnecting fuse element 708 as in the second embodiment, and leakage path to ground potential from the precharging power supply is cut off by cutting off the connection between precharge potential supply interconnection VBL and the bit line pair.

Semiconductor memory device 200 of the fourth embodiment differs from semiconductor memory device 100 of the second embodiment in that potential level and impedance state of power supply interconnection $PV_0$ are made controllable by $\phi_L$, as described in the following.

The operation of test circuit 70 will now be described in more detail.

FIG. 12 is a timing chart for illustrating the operation of test circuit 70.

i) The case in which fuse element 708 is not cut

When power supply is turned on at time t1, signal $\phi_L$ is at "L" level and thus it is conductive with P channel MOS transistor 704, and node N1 is charged to "H" level. As will be described later, when signal $\phi_L$ changes to "H" level at time t2 which comes upon expiration of a prescribed time period after turning on of the power supply, N channel MOS transistor 706 is rendered conductive and node N1 is discharged to obtain a potential level of "L." Accordingly, P channel MOS transistor 712 is rendered conductive and potential level of power supply interconnection $PV_0$ is pulled up to power supply potential $V_{CC}$.

In response to the change of signal $\overline{RAS}$ to an activated state (i.e., "L" level) at time t3, control circuit 7 changes signal $\phi_L$ to "L" level again until time t4 which comes after expiration of a predetermined time period. In response to this change, the potential level of node N1 is also changed to "H" level, but is pulled down to "L" level in response to signal $\phi_L$ being changed to "H" level again. During this period, the potential level of power supply interconnection $PV_0$ is substantially unchanged.

Signal $\phi_L$ attains "L" level during the period between time t3 and time t4 when signal $\overline{RAS}$ attains "L" level at time t3 because reset operation is required for test circuit 70 in order to determine the potential level of node N1.

ii) The case in which fuse element 708 is cut

Here, the potential level of node N1 and power supply interconnection $PV_0$ is shown by dotted lines in FIG. 12. When the power supply is turned on at time t1, the potential level of node N1 is raised to "H" level. Even when signal $\phi_L$ attains "H" level and N channel MOS transistor 706 is rendered conductive at time t2, the potential of node N1 is still at "H" level since there is no path for discharging node N1.

Accordingly, N channel MOS transistors 714 and 716 are both rendered conductive and the potential of power supply line $PV_0$ is pulled down to ground potential. Then, transistor 701 is rendered conductive, and the potential level of node N1 is maintained at "H" level.

Therefore, power supply line $PV_0$ is set at ground potential, and N channel MOS transistors 514, 524, 535 and 544 are rendered non-conductive so that connection between precharge potential supply interconnection VBL and the bit line pair is cut off. Accordingly, even when there is a failure due to short-circuit between the bit line and the word line (hereinafter referred to as mode S1), the leakage current during the standby period is cut off.

In addition, since power supply line $PV_0$ and column selecting line CSL are both at "L" level during standby and there would be no potential difference between them, the leakage current is suppressed even when there is a failure due to short-circuit between power supply line $PV_0$ and column selecting line CSL (hereinafter referred to as mode S2).

When there is a failure due to short-circuit in the above structure, inactivation is performed on every four memory cell columns. The inactivated columns are replaced by the spare memory cell columns in the redundant memory cell array 3b. By this replacement, redundant memory cell columns are activated instead of the memory cell coles in which defective operation exists owing to failure due to short-circuit in the fourth embodiment also, so that the defective operation is remedied. Moreover, since the leakage current path at the memory cell column in which failure due to short-circuit exists is cut off, increase of leakage current during standby operation is also suppressed.

However, if leakage current is caused by failure due to short-circuit of the above-described mode S1 or mode S2 is small, the operation of the memory cell column itself will not be defective, and thus the memory cell column in which the small amount of leakage current as described above exits may not be discovered by an ordinary operation test.

Even in the case as described above, presence of such leakage current would lead to a serious problem for occasions such as when semiconductor memory device 200 is operated by battery.

In semiconductor memory device 100 of the fourth embodiment shown in FIG. 11, the memory cell column in which a small amount of leakage current as described above exists can be discovered by an operation test in a test mode as described in the following.

The operation of this test mode is as follows.

(1) Test mode for detecting failure due to short-circuit between power supply line $PV_0$ and column selecting line CSL, i.e., mode S2

Figure 14:
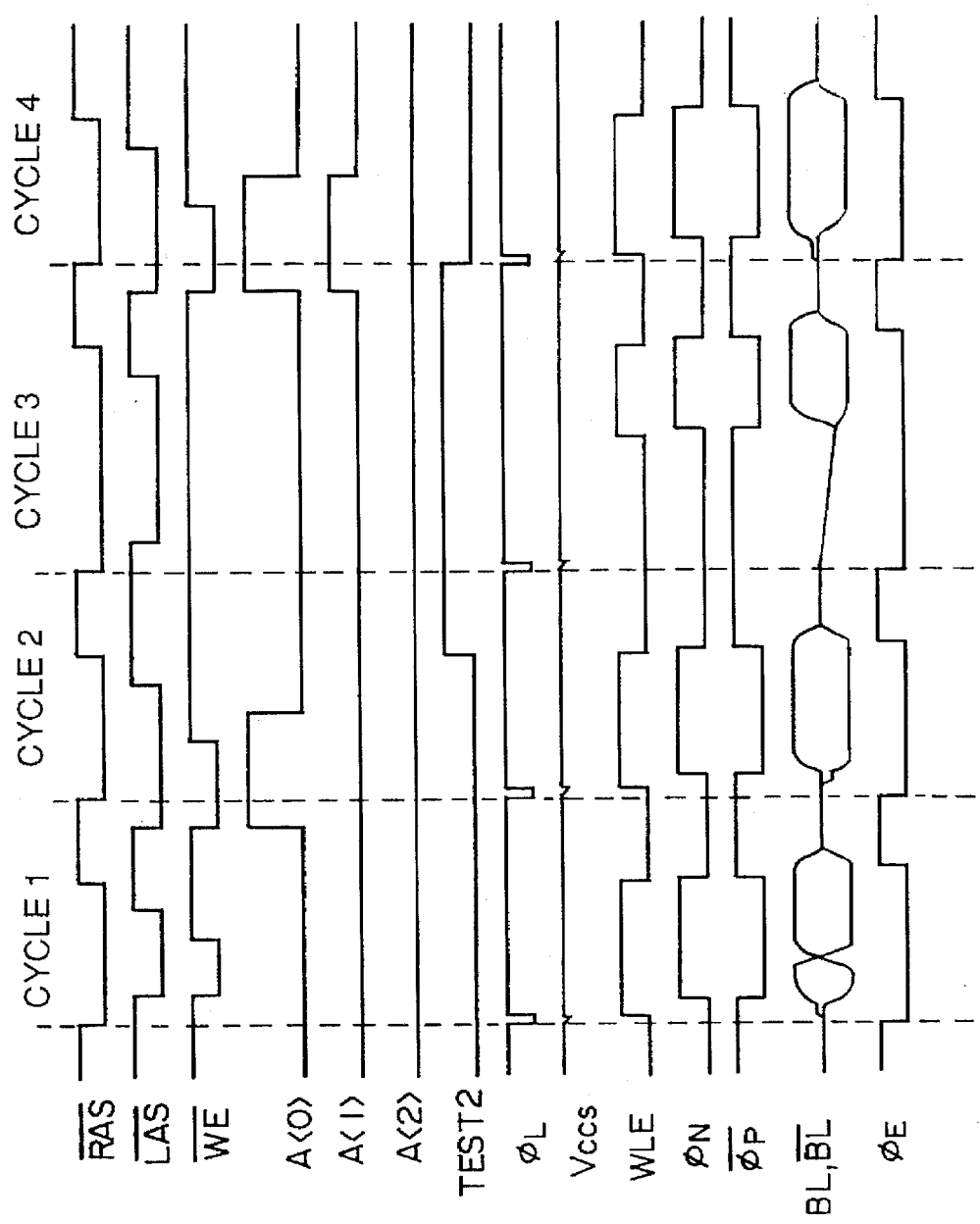
FIG. 14 is a timing chart for illustrating the operation of the test mode for detecting failure due to short-circuit between the word line and the bit line pair.

FIG. 14 is a timing chart for illustrating test mode for detecting failure due to short-circuit by which a small amount of leakage current is produced between power supply line $PV_0$ and column selecting line CSL, that is, a failure of mode S2.

In cycle 1, data at "H" level is written into the memory cell column to be tested, in a similar manner as that of an ordinary writing operation.

In cycle 2, signals $\overline{CAS}$ and $\overline{WE}$ are set at "L" level prior to signal $\overline{RAS}$ (a so-called CBR mode), and the potential of pulse signal A[0] is made higher than power supply potential by 3|Vthp| or more (where Vthp is the threshold voltage of P channel MOS transistor). In addition, the address signal A[1] is set at "L" level, and address signal A[2] is set at "H" level. In response, test mode signal TEST1 attains "H" level at a timing by which signal $\overline{RAS}$ attains "H" level. Owing to transition of this test mode signal TEST1 to "H" level, control circuit 7 outputs an internal control signal corresponding to the test mode, as will be described below.

In cycle 3, data is read out from the memory cell to which "H" level has been written during cycle 1. During cycle 3, data at "H" level is amplified by the sense amplifier, and then, signal $\phi_L$ attains "L" level after a prescribed time period has passed. In response to this transition, N channel MOS transistor 716 in FIG. 11 is rendered non-conductive. In addition, P channel MOS transistor 704 is rendered conductive and the potential level of node N1 will be at "H" level, so that P channel MOS transistor 712 would also be rendered non-conductive. Accordingly, power supply line $PV_0$ would be at a floating state, being cut off from both power supply potential $V_{CC}$ and ground potential $V_{SS}$.

Furthermore, during the period of test mode, column decoder activation signal CDES is at "L" level in response to signal TEST1 attaining "H" level. Therefore, the potential of column selecting line CSL is at "L" level.

Thus, when there is a failure due to short-circuit between power supply line $PV_0$ and column selecting line CSL, the potential of power supply line $PV_0$ attains "L" level because of the leakage current. Accordingly, when data is written again to a memory cell at cycle 3, the level of potential supplied to the sense amplifier is made lower, such that the level of potential at "H" level rewritten to the memory cell is made lower.

In cycle 4, signals $\overline{CAS}$ and $\overline{WE}$ are set at "L" level prior to signal $\overline{RAS}$, and the potential of address signal A[0] is made higher than the power supply potential by 3|Vthp| or more. In addition, address signal A[1] is set at "H" level. Then, test mode signal TEST1 attains "L" level and the test mode is finished.

In cycle 5, data is read out from the memory cell to which "H" level has been written during cycle 1. When there is a failure of mode S2 due to short-circuit between power supply line $PV_0$ and column selecting line CSL, rewrite operation is not performed to the memory cell at a normal potential level corresponding to "H" level, and thus data at "H" level is not read out from this memory cell. Accordingly, the memory cell column in which failure of mode S2 due to short-circuit between power supply line $PV_0$ and column selecting line CSL exists can be detected by this test mode.

(2) Test mode for detecting failure due to short-circuit between the word line and the bit line FIG. 14 is a timing chart for illustrating the test mode operation for detecting failure of mode S1 when there is a failure of mode S1 due to short-circuit between the word line and the bit line.

In cycle 1, data at "L" level is written to a memory cell column of interest.

In cycle 2, signals $\overline{CAS}$ and $\overline{WE}$ are set at "L" level prior to signal $\overline{RAS}$, and the potential of address signal A[0] is made higher than the power supply potential by 3|Vthp| or more. In addition, address signal A[1] is set at "L" level and address A[2] is set at "L" level. Then, test mode signal TEST2 attains "H" level at a timing by which signal $\overline{RAS}$ attains "H" level.

In cycle 3, data is read out from the memory cell to which "L" level has been written during cycle 1. As will be described later, when test mode TEST2 is at "H" level, control circuit 7 sets bit line equalizing signal BLEQ at "L" level and increases the time period between disconnection of bit line pair from the precharge power supply and the activation of row decoder activation signal WDE, sense amplifier activation signals $\phi_N$ and $\overline{\phi_P}$. More specifically, since the time period in which the bit line pair is held at precharge potential and the word line is at a deselected state (that is, a state in which its potential is at "L" level) is made longer, the precharge potential level of the bit line is made lower than in the normal operation when there is a failure due to short-circuit between the word line and the bit line.

Accordingly, operation margin in the readout of "L" level data from the memory cell is made smaller and readout of "L" level data would be unsuccessful in this cycle 3.

In cycle 4, signals $\overline{CAS}$ and $\overline{WE}$ are set at "L" level prior to signal $\overline{RAS}$, and the potential of address signal A[0] is made higher than the power supply potential by 3|Vthp| or more. In addition, address signal A[1] is set at "H" level. Thus, test mode signal TEST2 attains "L" level and test mode is finished.

By the test operation in the test mode as described above, the column in which failure of mode S1 due to short-circuit exists between the word line and the bit line can be detected.

Thus, in the fourth embodiment, it is made possible to detect a memory cell column in which a small amount of current leakage exists, and by inactivating such memory cell column, it is also made possible to cut off such leakage path as described above.

Also, as will be clearly understood from the description in the following, such test mode can also be applied to first and second embodiments.

Figure 15:
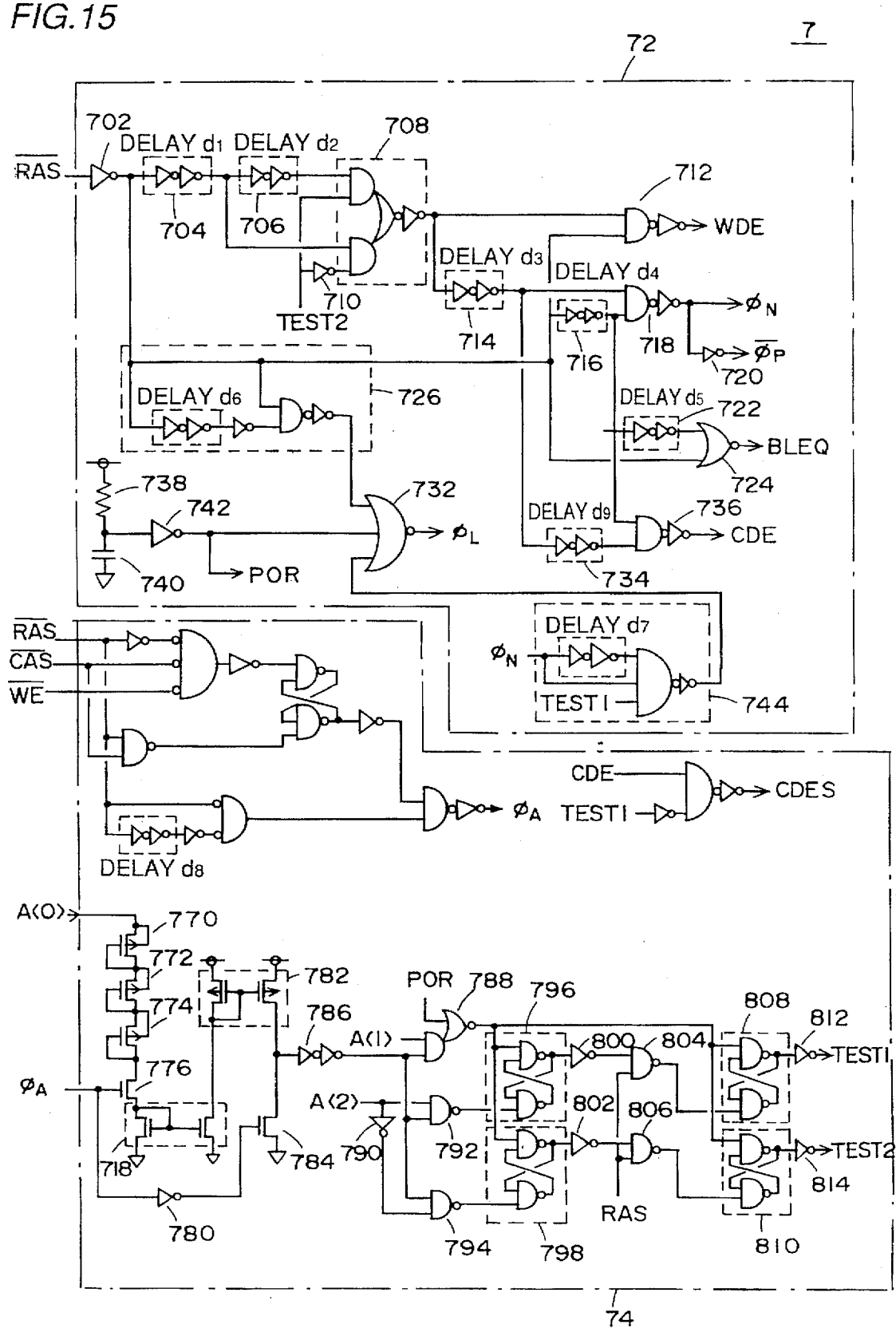
FIG. 15 is a circuit diagram showing the principal portions of control circuit 7.

FIG. 15 is a circuit diagram showing the principal portions of control circuit 7.

Control circuit 7 includes an internal control signal generating portion 72 and a test mode signal generating circuit 74. In the following, description is first made for the structure and operation of internal control signal generating circuit 72, assuming that a prescribed test mode is designated by external control signals $\overline{RAS}$, $\overline{CAS}$, $\overline{WE}$, address signals A[0], A[1], A[2] and the like and that test mode signal TEST1 or TEST2 is set at "H" level.

Thereafter, structure and operation of test mode signal generating circuit 74 will be described.

Internal control signal generating circuit 72 includes an inverting circuit 702 which receives external control signal $\overline{RAS}$, a delay circuit 704 which receives the output of inverting circuit 702 to delay the signal by a prescribed delay time d1, a delay circuit 706 which receives the output of delay circuit 704 to delay the signal by a prescribed delay time d2, an inverting circuit 710 which receives test .mode signal TEST2, a complex gate circuit 708 controlled by test mode signal TEST2 and the output of inverting circuit 710 through which either one of the output signal of delay circuit 704 and the output signal of delay circuit 706 passes, an AND circuit 712 which receives the output of inverting circuit 702 and the output of complex gate circuit 708 to output a signal WDE, a delay circuit 714 which receives the output of complex gate circuit 708 to delay the signal by a prescribed delay time d3, a delay circuit 716 which receives the output of inverting circuit 702 to delay the signal by a prescribed delay time d4, an AND circuit 718 which receives the output of delay circuits 714 and 716 to output a signal $\phi_N$, and an inverting circuit 720 which receives the output of AND circuit 718 to output signal $\overline{\phi_P}$.

Here, delay time d3 is assumed to be longer than delay time d4.

Internal control signal generating circuit 72 further includes a delay circuit 722 which receives the output of delay circuit 716 to delay the signal by delay time d5, an NOR circuit 724 which receives the output of inverting circuit 702 and the output of delay circuit 722 to output signal BLEQ, a delay circuit 734 which receives the output of delay circuit 714 to delay the signal by delay time d9, and an AND circuit 736 which receives the outputs of delay circuits 716 and 734 to output a signal CDE.

Internal control signal generating circuit 72 further includes a pulse generating circuit 726 which outputs a pulse signal having a prescribed pulse width d6 at "H" level in response to the falling edge of signal $\overline{RAS}$, that is, the rising edge of inverting circuit 702, a resistor 738 having its one end connected to power supply potential $V_{CC}$, a capacitor 740 connected between the other end of resistor 738 and ground potential $V_{SS}$, an inverting circuit 742 which receives the potential of the connection point of resistor 738 and capacitor 740 to output the signal POR, a pulse generating circuit 744 which is controlled by test mode signal TEST1 to output a pulse signal at "H" level having a prescribed pulse width d7 in response to change of signal $\phi_N$ to "H" level when signal TEST1 is at "H" level, and a 3-input NOR circuit 732 which receives the output of pulse generating circuit 726, signal POR and the output of pulse generating circuit 744 to output signal $\phi_L$.

Operation of internal control signal generating circuit 72 will now be described.

i) In the case where signal TEST1="H" level, and signal TEST2="L" level

Figure 16:
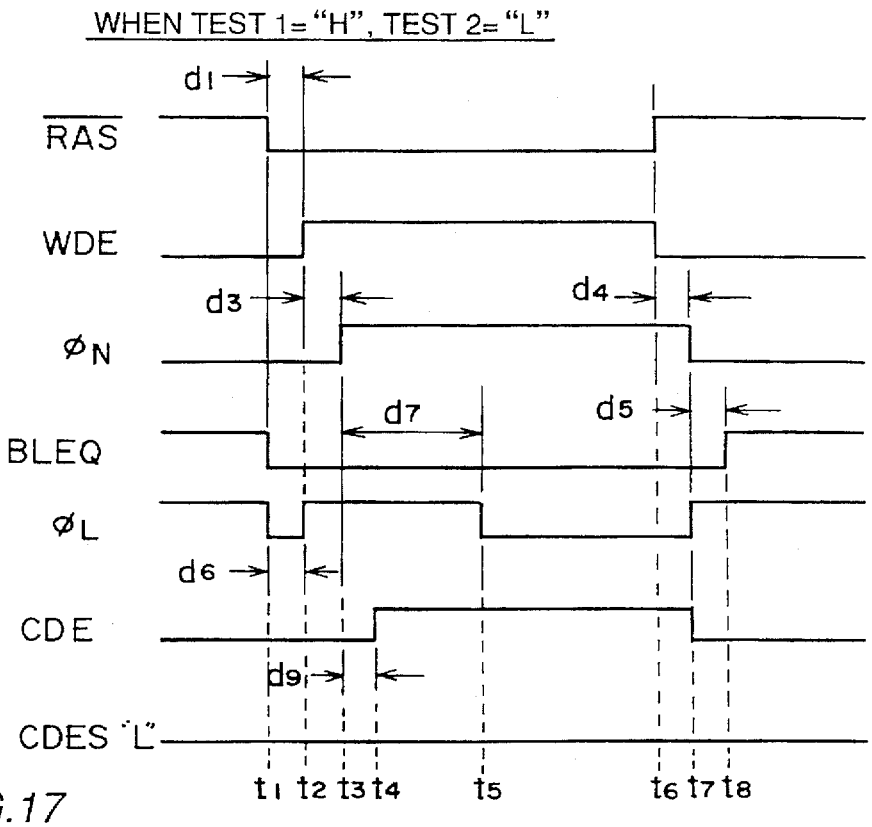
FIG. 16 is a first timing chart for illustrating the operation of internal control signal generating circuit 72.

FIG. 16 is a timing chart for illustrating the operation of internal control signal generating circuit 72 in the case where test mode signal TEST1 is at "H" level and signal TEST2 is at "L" level.

When row address strobe signal $\overline{RAS}$ falls to "L" level, output signal of delay circuit 704 is changed to "H" level with a delay of time d1 in response to this fall. At this time, since signal TEST2 at "L" level, the output signal of delay circuit 704 passes through complex gate circuit 708. Accordingly, AND circuit 712 which receives the output of inverting circuit 702 and the output of complex gate circuit 708 outputs a signal WDE at "H" level at time t2 after delay time d1 has passed after the falling edge of signal $\overline{RAS}$.

At time t1, in response to the change of output level of inverting circuit 702 to "H" level, the output level of delay circuit 716 also attains "H" level with the delay of delay time d4. Meanwhile, in response to the change of output level of complex gate circuit 708 to "H" level, the output level of delay circuit 714 also attains "H" level delayed by delay time d3. As described above, time d3 is longer than time d4 so that AND circuit 718 receiving the outputs of delay circuits 714 and 716 sets its output signal $\phi_N$ at "H" level at time t3 which is delayed from time t2 by time d3. Correspondingly to this change, signal $\overline{\phi_P}$ output from inverting circuit 720 is also changed from "H" level to "L" level to be in an activated state.

Meanwhile, in response to the change of output level of inverting circuit 702 to "H" level at time t1, the output signal BLEQ from NOR circuit 724 which receives this output of inverting circuit 702 as its input attains "L" level.

Meanwhile, in response to the rise of the output of inverting circuit 702 from "L" level to "H" level, a pulse signal is output from pulse generating circuit 726, and in response to this pulse signal, NOR circuit 732 changes its output signal $\phi_L$ to "L" level during time d6. Meanwhile, since the outputs of delay circuits 716 and 734 which are input to AND circuit 736 after delay of time d9 from time t3 at which the output of delay circuit 714 attains "H" level would both be "H" level, signal CDE at time t4 would be at "H" level.

In response to the change of signal $\phi_N$ to "H" level at time t3, the output of delay gate circuit 744 would attain "H" level after a delay of time period d7 from time t3, since signal TEST1 is at "H" level. In response, $\phi_L$ which is the output signal of NOR circuit 732 also attains "L" level again.

In response to the rise of signal $\overline{RAS}$ to "H" level at time t6, one input to AND circuit 712 would attain "L" level so that signal WDE falls to "L" level. In addition, at time t7 which comes after a delay of time d4 by delay circuit 716, the level of one input to AND circuit 718 would be at "L" level, and signal $\phi_N$ also falls to "L" level. Meanwhile, the output of delay circuit 722 attains "L" level after a delay by time period d5 from time t7 and inputs to NOR circuit 724 both attain "L" level, such that signal BLEQ at time t8 rises to "H" level. The output of delay gate circuit 744 attains "L" level in response to the change of signal $\phi_N$ to "L" level, so that output signal $\phi_L$ from NOR circuit 732 which receives this signal $\phi_N$ as its input also rises to "H" level at time t7.

In addition, at time t7 when the output of delay circuit 716 attains "L" level, the output signal CDE of AND circuit 736 also falls to "L" level.

Figure 13:
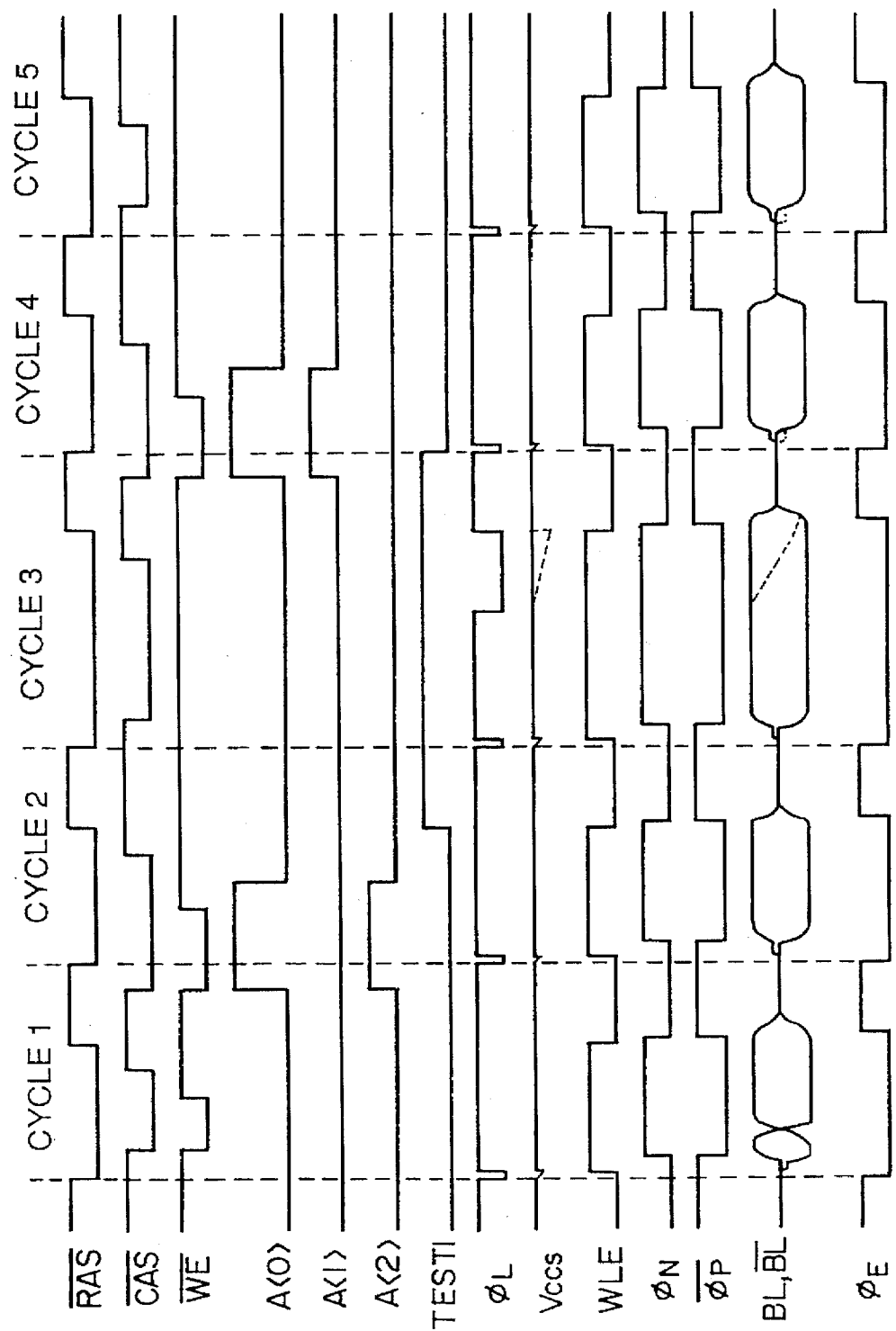
FIG. 13 is a timing chart for illustrating the test mode for detecting failure due to short-circuit between the word line and the bit line pair.

By the output operation of internal control signal as described above, test operation for finding failure of mode S2 is made possible during the time period in which signal TEST1="H" level as shown in FIG. 13.

More specifically, after the word line is activated by signal WDE, the sense amplifier is activated by signals $\phi_N$ and $\overline{\phi_P}$, data is read out from the selected memory cell, and the potential level of bit line pair is amplified, signal $\phi_L$ would be at "L" level during the time period between time t5 and time t7 shown in FIG. 16. In response, power supply interconnection PV$_0$ would be at a floating state such that the level of potential supplied to the sense amplifier is made lower when there is a leakage between power supply interconnection PV$_0$ and column selecting line, and thus an "H" level signal at a normal potential level would not be written to the memory cell column in which the above-described leakage exists.

ii) the case in which signal TEST1="L" level and signal TEST2="H" level

Here, in internal control signal generating circuit 72 shown in FIG. 15, output signal from delay circuit 706 passes through complex gate circuit 708 in response to signal TEST2 being at "H" level. Accordingly, time period between the fall of signal $\overline{RAS}$ to "L" level and the rise of signal WDE to "H" level is changed with respect to the timing of the signal change in the case shown in FIG. 16, from time d1 to time (d1+d2). Signals $\overline{RAS}$, WDE, $\phi_N$, $\overline{\phi_P}$, and signal BLEQ are similar to those shown in FIG. 16, except for that their timing of change are delayed by this delay time d2.

Meanwhile, since the output of delay gate circuit 744 would be always at "L" level in response to signal TEST1 being at "L" level, signal $\phi_L$ would be at "L" level only during the time period between time t1 and time t2 in response to the output of pulse generating circuit 726.

Figure 17:
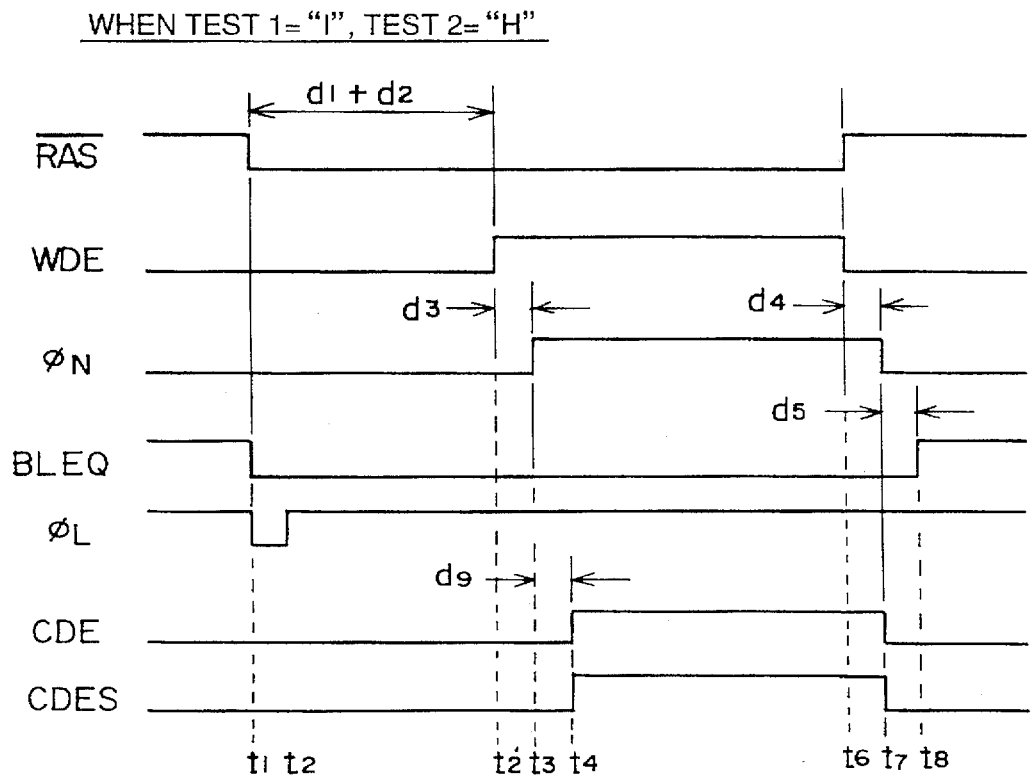
FIG. 17 is a second timing chart for illustrating the operation of internal control signal generating circuit 72.

Accordingly, after bit line equalizing signal BLEQ has attained "L" level and connection between bit line pair and precharge power supply is cut off, signal WDE would attain "H" level and the time required for the word line to be activated would be longer in the case of FIG. 17 as compared to FIG. 16, thus enabling detection of failure of mode S1 due to short-circuit between the word line and the bit line as has been described with reference to FIG. 14.

Structure and operation of test mode signal generating circuit 74 in FIG. 15 will now be described in the following.

Figure 18:
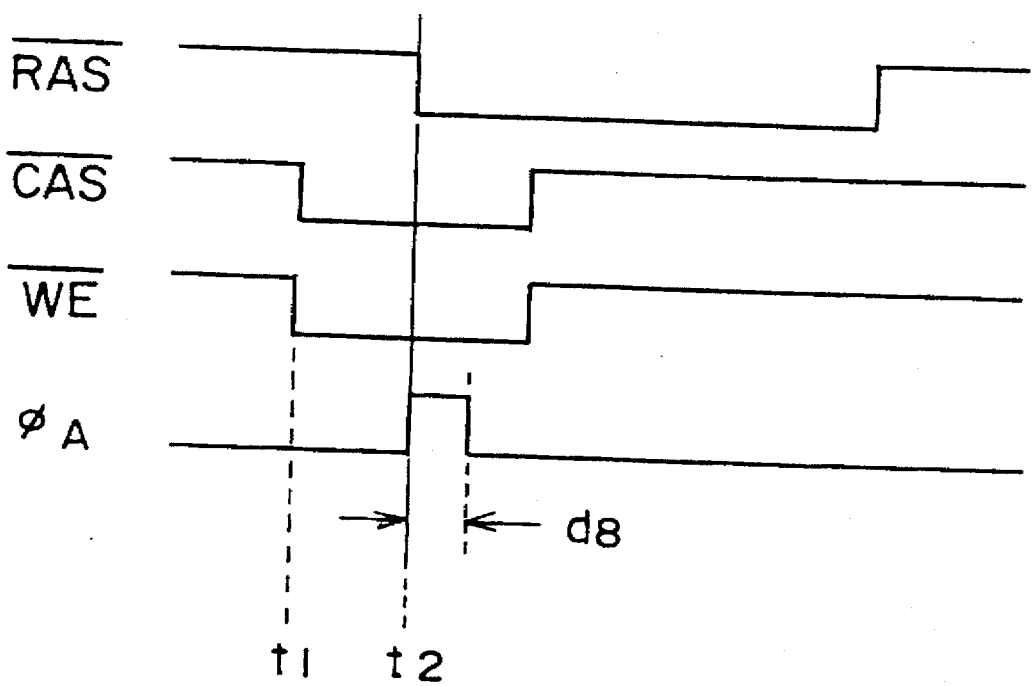
FIG. 18 is a timing chart for illustrating the operation of test mode signal generating circuit 74.
Figure 20:
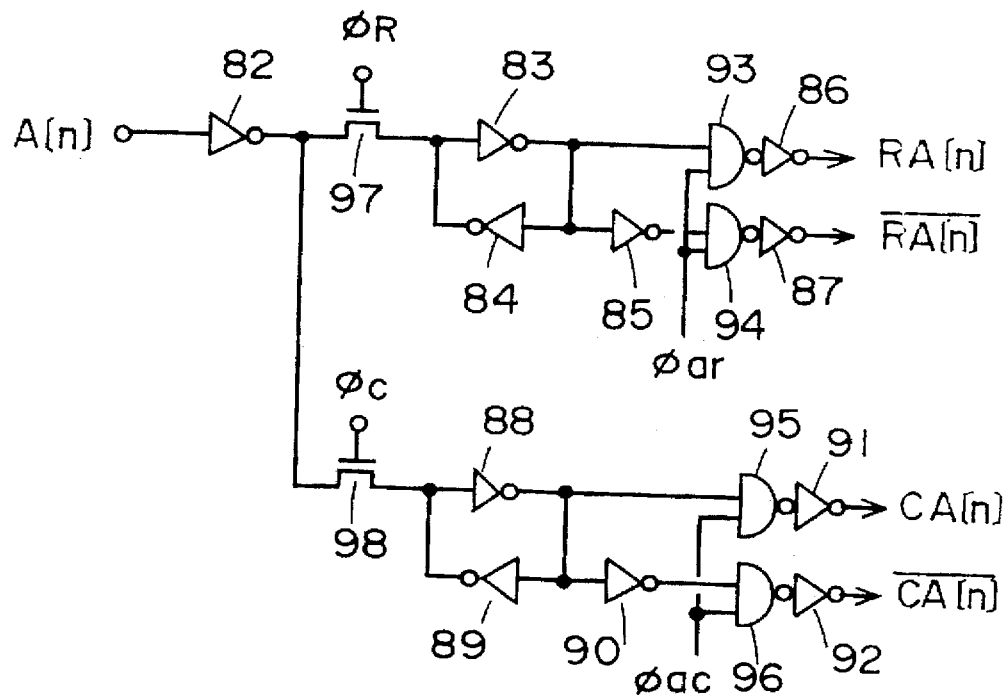
FIG. 20 is a circuit diagram showing a structure of an address buffer circuit of the first conventional example.
Figure 21:
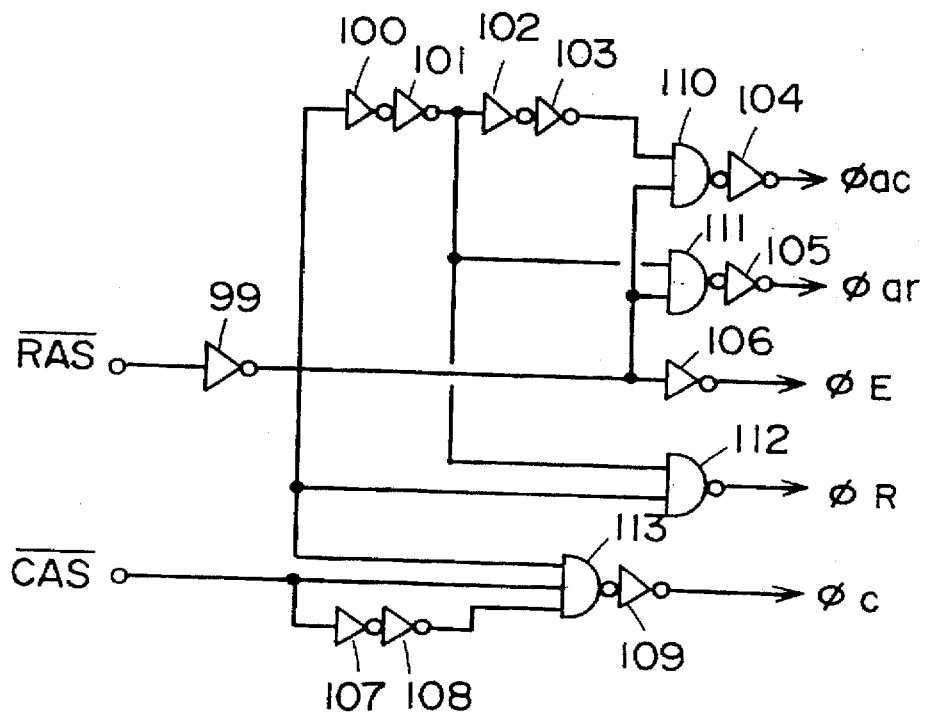
FIG. 21 is a circuit diagram showing the structure of a control signal generating circuit of the first conventional example.
Figure 22:
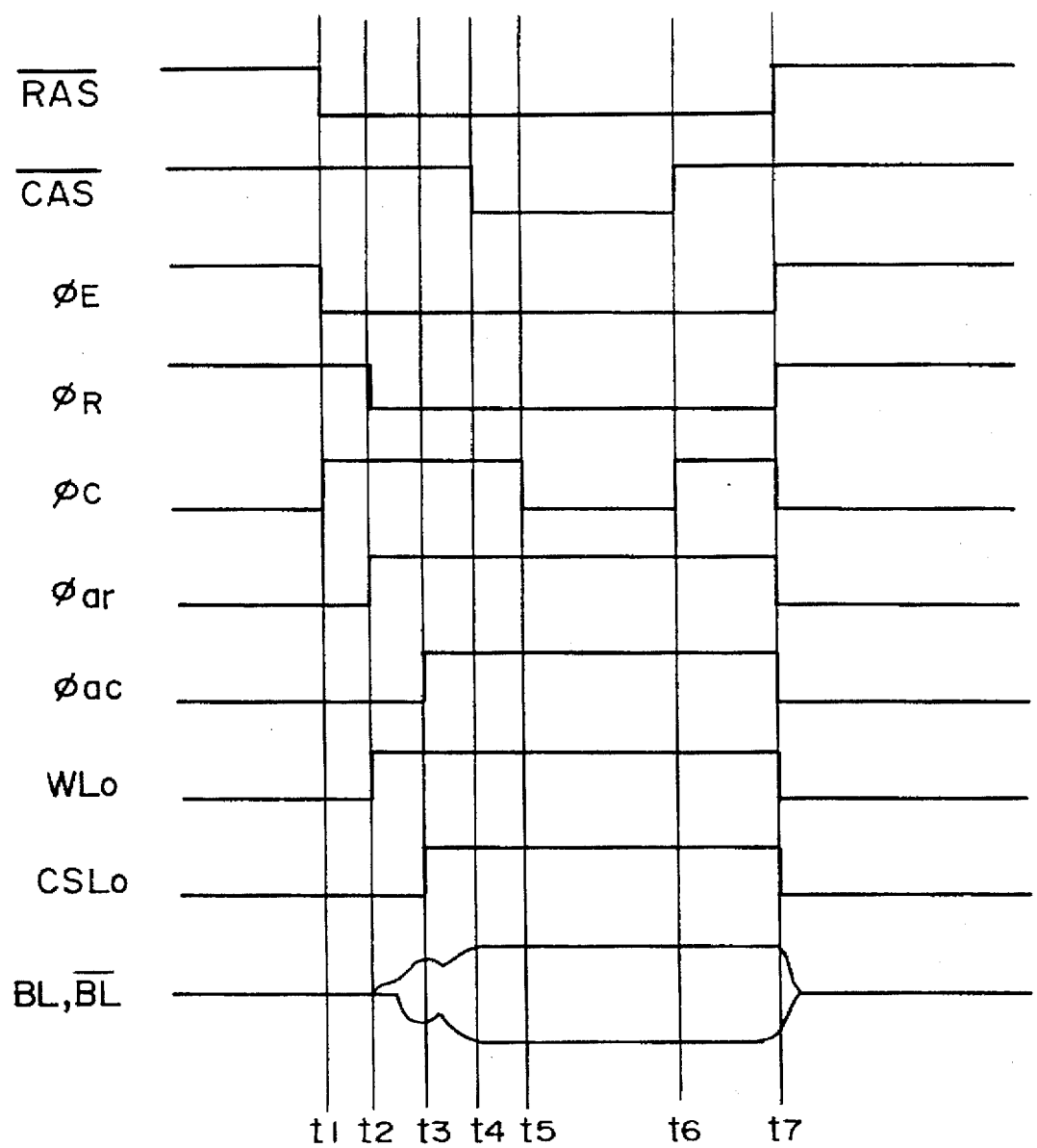
FIG. 22 is a timing chart illustrating the operation of the first conventional example.
Figure 23:
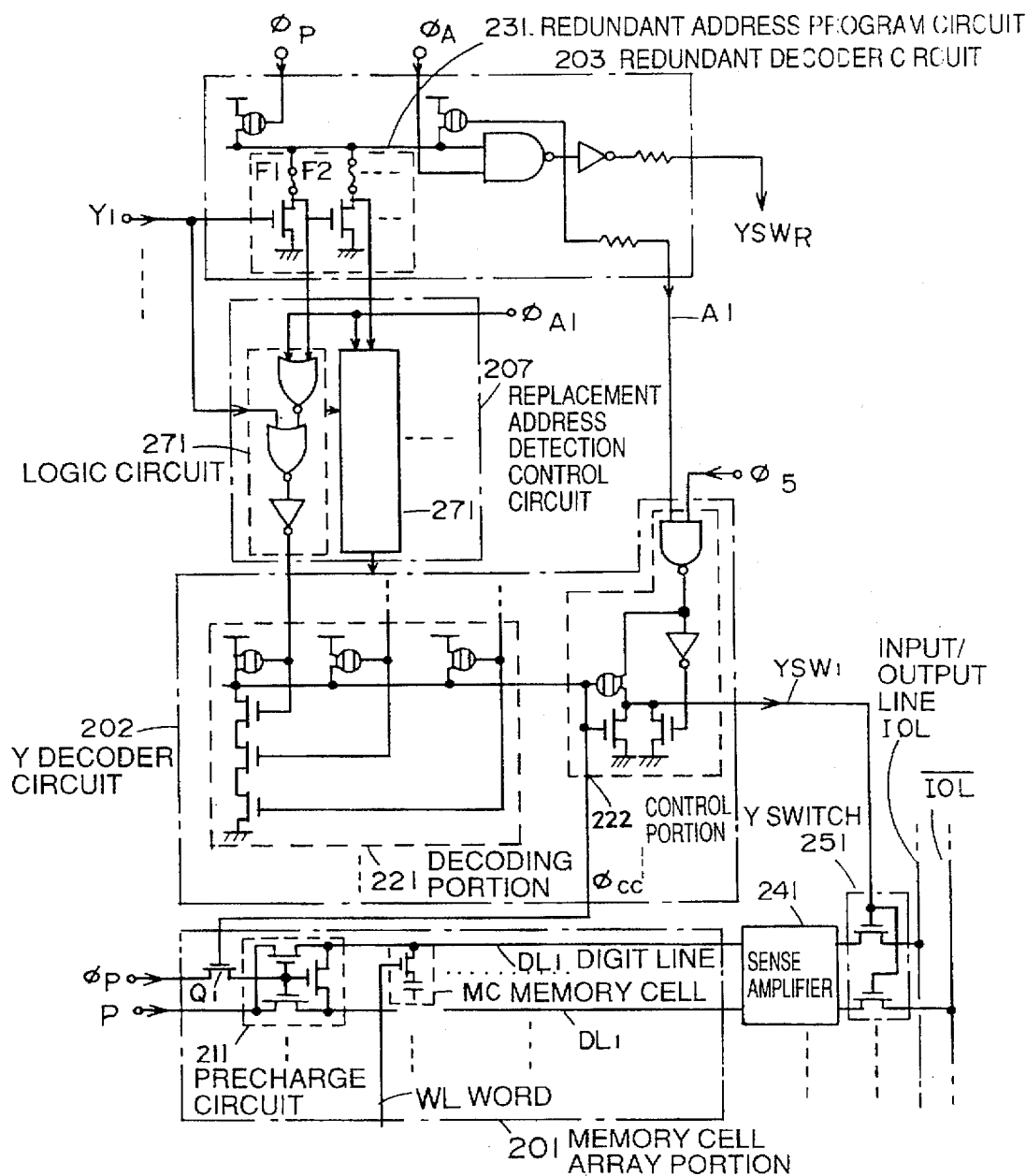
FIG. 23 is a circuit diagram showing the principal portions of the structure of a semiconductor memory device according to a second conventional example.

Test mode signal generating circuit 74 includes an inverting circuit 752 which receives signal $\overline{RAS}$, an OR circuit 754 which receives the output of inverting circuit 752, signal $\overline{CAS}$ and signal $\overline{WE}$, an NAND circuit 760 which receives signals $\overline{RAS}$ and $\overline{CAS}$, a flipflop circuit 756 which receives the outputs of OR circuit 754 and NAND circuit 760, an inverting circuit 758 which receives the output of flipflop circuit 756, a pulse signal generating circuit 762 which generates a pulse signal at "H" level having a pulse width d8 in response to the falling edge of signal $\overline{RAS}$, and an AND circuit 764 which receives the output of pulse signal generating circuit 762 and the output of inverting circuit 758 to output signal $\phi_A$. FIG. 18 is a timing chart for illustrating the change of signal $\phi_A$.

When signals $\overline{CAS}$ and $\overline{WE}$ both falls to "L" level at time t1 and signal $\overline{RAS}$ falls to "L" level at time t2, an "H" level signal $\phi_A$ having a pulse width d8 is output from AND circuit 764.

In other combinations of signals $\overline{RAS}$, $\overline{CAS}$, and $\overline{WE}$, signal $\phi_A$ is maintained at "L" level.

Test mode signal generating circuit 74 further includes P channel MOS transistors 770 to 774 each diode-connected in series which receive address signal A [0] at one end, an N channel MOS transistor 776 having its drain connected to the other end of P channel MOS transistors 770 to 774 and receiving signal CA at its gate, a current mirror circuit 778 having its one power supply input connected to N channel MOS transistor 776, an inverting circuit 780 receiving signal $\phi_A$, an N channel MOS transistor 784 receiving the output of inverting circuit 780 at its gate and having its source connected to ground potential, a current mirror circuit 782 connected between the other power supply input of current mirror circuit 778 as well as the drain of N channel MOS transistor 784 and power supply potential V$_{CC}$, and a delay circuit 786 which receives the potential of the connection point of current mirror circuit 782 and N channel MOS transistor 784 as its input and which has two inverting circuits connected in series.

Accordingly, the output level of delay circuit 786 would be at "H" level during the period in which address signal A [0] is higher than the power supply potential by 3|Vthp| or more and signal $\phi_A$ is at "H" level.

Test mode signal generating circuit 74 further includes a complex gate 788 which receives signal POR, address signal A [1] and the output of delay circuit 786, an AND circuit 792 which receives address signal A [2] and the output of delay circuit 786, an inverting circuit 790 which receives signal A [2], an NAND circuit 794 which receives the outputs of delay circuit 786 and inverting circuit 790, a flipflop circuit 796 which receives the outputs of complex gate 788 and NAND circuit 792, a flipflop circuit 798 which receives the outputs of complex gate 788 and NAND circuit 794, an inverting circuit 800 which receives the output of flipflop circuit 796, an inverting circuit 802 which receives the output of flipflop circuit 798, an NAND circuit 804 which receives the output of inverting circuit 800 and signal RAS as its input, an NAND circuit 806 which receives the output of inverting circuit 802 and signal RAS as its input, a flipflop circuit 808 which receives the output of NAND circuit 804 and the output of complex gate circuit 788, a flipflop circuit 810 which receives the output of NAND circuit 806 and the output of complex gate 788, an inverting circuit 812 which receives the output of flipflop circuit 808 to output signal TEST1, and an inverting circuit 814 which receives the output of flipflop circuit 810 to output signal TEST2.

Signal POR is a signal which is output from internal control signal generating circuit 72, and its potential after turning on attains "L" level.

Assumption is now made first that address signal A [1] is at "L" level and address signal A [2] is at "H" level. At this time, if the output of inverting circuit 786 changes to "H" level, the output of NAND circuit 792 is changed to "L" level from "H" level in response to this change. The output levels of complex gate circuit 788 and NAND circuit 794 are unchanged.

Accordingly, in response to the change of the output level of NAND circuit 792, the state of flipflop circuit 796 makes a transition, and the output level of inverting circuit 800 changes to "H" level. Thereafter, in response to the change of signal $\overline{RAS}$ to "H" level, NAND circuit 804 also changes its output level to "L" level. In response, the state of flipflop circuit 808 also makes a transition and the output level of inverting circuit 812 is changed from "L" level to "H" level.

Therefore, signal TEST1 attains "H" level from "L" level and test mode for detecting failure S2 due to short-circuit is initiated.

Thus, condition for CAS before RAS is satisfied, and when address signal A [0] is higher than the power supply potential by 3|Vthp| or more and when address signal A [1] is at "L" level while signal A [2] is at "H" level, signal TEST1 would be activated (i.e., will be at "H" level) in response to the change of signal $\overline{RAS}$ to "H" level.

Thus, change of signal TEST1 to "H" level during cycle 2 shown in FIG. 13 is implemented.

Meanwhile, if address signal A [1] is at "H" level and the output of delay circuit 786 is changed to "H" level, the output of complex gate 788 would be at "L" level in response to this change. In response, the state of flipflop circuit 796 makes a transition again such that the output of inverting circuit 800 would be at "L" level. In response to the change of signal $\overline{RAS}$ to "L" level, the output of NAND circuit 804 changes to "H" level. In response, the state of flipflop circuit 808 makes a transition again, and the output of inverting circuit 812, that is, signal TEST1 is changed to "L" level.

Thus, the change of signal TEST1 from "H" level to "L" level during cycle 4 shown in FIG. 13 is implemented.

Method of starting and finishing the test mode for detecting failure S1 due to short-circuit would now be described in the following.

When condition for CAS before RAS is satisfied in cycle 2 shown in FIG. 14 and the potential of address signal A [0] is higher than the power supply potential by 3|Vthp| or more, and when address signal A [1] is at "L" level while signal A [2] is at "L" level, the output of NAND circuit 794 changes from "H" level to "L" level in response to the change of output of delay circuit 786 to "H" level. In response, the state of flipflop circuit 798 makes a transition and the output of inverting circuit 802 changes to "H" level. When signal $\overline{RAS}$ changes to "H" level under this condition, the output of NAND gate circuit 806 would attain "L" level and the state of flipflop circuit 810 would make a transition. Responsively, signal TEST2 would change to "H" level.

Thus, the change of signal TEST2 in cycle 2 shown in FIG. 14 is implemented.

Meanwhile, if the output of delay circuit 786 changes to "H" level when address signal A [1] is at "H" level, the output of complex gate 788 would attain "L" level and the state of flipflop circuit 798 makes a transition. In response, the output of inverting circuit 802 would attain "L" level. Accordingly, in response to the change of signal $\overline{RAS}$ to "L" level, the output of NAND circuit 806 would attain "H" level and the state of flipflop circuit 810 would make a transition, so that signal TEST2 returns to "L" level.

Thus, the change of signal TEST2 in cycle 4 shown in FIG. 14 is implemented.

By the operation of control circuit 7 described above, initiation and termination of the test mode for detecting failure of mode S1 or S2 due to short-circuit is designated by the combination of the changes in signal level of signals $\overline{RAS}$, $\overline{CAS}$, $\overline{WE}$, address signals A [0], A [1] and A [2].

Therefore, it is made possible to cut off the slight leakage path in the standby state by detecting the memory cell column in which the slight leakage current is generated by this test mode and cutting the fuse element 708 shown in FIG. 11 according to the result of the detection.

Thus, it is made possible to detect a memory cell column in which there is a small amount of leakage current which is impossible to detect in a normal operation test, and to reduce the power consumption during standby in the semiconductor memory device 200.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of word lines, a plurality of bit line pairs crossing said plurality of word lines and a plurality of memory cells connected to these word lines and bit line pairs;
   a precharge potential supply interconnection for supplying precharge potential of said bit line pairs;
   power supply interconnections arranged parallel to said bit line pairs, there being at least one of said power supply interconnections for every set of a predetermined number of said bit line pairs;
   power supply interconnection potential setting means existing in every one of said power supply interconnection for setting the supplying potential at either one of first and second potential according to whether there is a defective bit in the corresponding one of said bit line pairs; and
   a plurality of bit line equalizing means provided corresponding to said bit line pair for opening/closing the connection between said bit line pair and said precharge power supply in response to external bit line equalizing signal when said power supply interconnection potential is set at the first potential and for rendering the connection non-conductive when said power supply interconnection potential is set at said second potential level.

2. The semiconductor memory device according to claim 1, wherein
   each said power supply interconnection potential setting means includes
   a defective bit address storing means for storing information on whether there is a defective bit in the set of the predetermined number of said bit line pairs in a nonvolatile manner; and
   a driving means for setting said power supply interconnection potential at either one of the first and second potentials according to the stored information in said defective address storing means.

3. The semiconductor memory device according to claim 1, further including:
   a row selecting means activated upon activation of row decoder activation signal for selecting said word line in accordance with a row address signal;

a plurality of sense amplifiers arranged corresponding to said bit line pairs, each activated upon activation of a sense amplifier activation signal for amplifying the potential difference of said bit line pair in accordance with data of memory cell connected to said selected word line; and control means for outputting said bit line equalizing signal, said row decoder activation signal and said sense amplifier activation signal in accordance with an external control signal, wherein said control means provide a longer delay time between the time when said bit line equalizing signal is inactivated to cut off the connection of said bit line pair and said precharging power supply and the time when said row decoder activation signal and said sense amplifier activation signal are activated for a period in which test mode is designated, as compared to a delay time provided for a period in which test mode is not designated in accordance with said external control signal.

4. The semiconductor memory device according to claim 1, wherein said set of bit line pairs is formed of two pairs of bit lines.

5. The semiconductor memory device according to claim 4, wherein each said power supply interconnection potential setting means includes a defective address storing means for storing information on whether there is a defective bit in the set of said bit line pairs in a non-volatile manner; and a driving means for setting said power supply interconnection potential at either one of the first and second potentials according to the stored information in said defective address storing means.

6. The semiconductor memory device according to claim 4, wherein each said bit line equalizing means includes first and second MOSFETs connected in series between said bit line pair for receiving said bit line equalizing signal commonly at their gates; and a third MOSFET connected between a connection node of said first and second MOSFETs and said precharge potential supply interconnection having its gate connected to said power supply interconnection.

* * * * *